(12) United States Patent
Ikenaga et al.

(10) Patent No.: US 9,349,895 B2
(45) Date of Patent: May 24, 2016

(54) ENCAPSULATING MATERIAL FOR SOLAR CELL AND SOLAR CELL MODULE

(75) Inventors: Shigenobu Ikenaga, Chiba (JP); Fumito Takeuchi, Chiba (JP); Keiji Watanabe, Ichihara (JP); Tomoaki Ito, Ichihara (JP)

(73) Assignees: MITSUI CHEMICALS, INC., Tokyo (JP); MITSUI CHEMICALS TOHCELLO, INC., Tokyo (JP)

( * ) Notice: Subject to any disclaimer, the term of this patent is extended or adjusted under 35 U.S.C. 154(b) by 40 days.

(21) Appl. No.: 13/882,218

(22) PCT Filed: Oct. 31, 2011

(86) PCT No.: PCT/JP2011/006095
§ 371 (c)(1),
(2), (4) Date: Apr. 29, 2013

(87) PCT Pub. No.: WO2012/060086
PCT Pub. Date: May 10, 2012

(65) Prior Publication Data
US 2013/0213471 A1  Aug. 22, 2013

(30) Foreign Application Priority Data
Nov. 2, 2010  (JP) ................................. 2010-246253

(51) Int. Cl.
*H01L 31/048*  (2014.01)
*C08F 210/16*  (2006.01)
(Continued)

(52) U.S. Cl.
CPC .......... *H01L 31/0481* (2013.01); *C08F 210/16* (2013.01); *C08K 5/14* (2013.01);
(Continued)

(58) Field of Classification Search
None
See application file for complete search history.

(56) References Cited

U.S. PATENT DOCUMENTS 5,955,198 A * 9/1999 Hashimoto et al. ........... 428/414
2001/0014718 A1  8/2001 Kagami et al.
(Continued)

FOREIGN PATENT DOCUMENTS

CN  1165529 A  11/1997
JP  9-183871 A  7/1997
(Continued)

OTHER PUBLICATIONS

International Search Report (PCT/ISA/210) issued on Jan. 24, 2012, by the Japanese Patent Office as the International Searching Authority for International Application No. PCT/JP2011/006095.
(Continued)

*Primary Examiner* — Ling Choi
*Assistant Examiner* — Catherine S Branch
(74) *Attorney, Agent, or Firm* — Buchanan, Ingersoll & Rooney PC

(57) ABSTRACT

An encapsulating material for solar cell excellent in a balance among properties including transparency, flexibility, adhesiveness, heat resistance, appearance, crosslinking properties, electrical properties and calender moldability. The encapsulating material includes an ethylene/α-olefin copolymer satisfying the following requirements: (a1) the content ratio of structural units derived from ethylene is from 80 to 90 mol % and the content ratio of structural units derived from α-olefin having 3 to 20 carbon atoms is from 10 to 20 mol %; (a2) MFR is equal to or more than 2 g/10 minutes and less than 10 g/10 minutes as measured under the conditions of a temperature of 190 degrees centigrade and a load of 2.16 kg in accordance with ASTM D1238; (a3) the density is from 0.865 to 0.884 g/cm³ as measured in accordance with ASTM D1505; and (a4) the shore A hardness is from 60 to 85 as measured in accordance with ASTM D2240.

14 Claims, 2 Drawing Sheets

(51) Int. Cl.
  *C08L 23/08* (2006.01)
  *C09D 123/08* (2006.01)
  *C08K 5/14* (2006.01)
  *C08K 5/5425* (2006.01)
  *C08L 23/26* (2006.01)

(52) U.S. Cl.
  CPC .......... *C08K 5/5425* (2013.01); *C08L 23/0815* (2013.01); *C09D 123/0815* (2013.01); *C08L 2023/40* (2013.01); *C08L 2023/42* (2013.01); *C08L 2203/204* (2013.01); *Y02E 10/50* (2013.01)

(56) References Cited

U.S. PATENT DOCUMENTS

| | | | |
|---|---|---|---|
| 2003/0176124 | A1 | 9/2003 | Koike et al. |
| 2004/0186237 | A1* | 9/2004 | Kagami et al. ................ 525/240 |
| 2007/0071970 | A1 | 3/2007 | Koike et al. |
| 2007/0251572 | A1 | 11/2007 | Hoya et al. |
| 2007/0267059 | A1 | 11/2007 | Nishijima et al. |
| 2010/0108127 | A1 | 5/2010 | Hayes |
| 2010/0313956 | A1 | 12/2010 | Nishijima et al. |
| 2013/0000694 | A1* | 1/2013 | Bunea et al. ................ 136/246 |

FOREIGN PATENT DOCUMENTS

| | | | |
|---|---|---|---|
| JP | 9-234815 A | | 9/1997 |
| JP | 2000-289157 A | | 10/2000 |
| JP | 2005-126571 A | | 5/2005 |
| JP | 2006-210906 A | | 8/2006 |
| JP | 2008-205448 A | | 9/2008 |
| JP | 2010-053298 A | | 3/2010 |
| JP | 2010-155915 | | 7/2010 |
| JP | 2010-258439 A | | 11/2010 |
| WO | WO 9710295 A1 | * | 3/1997 |
| WO | WO 02/074532 A1 | | 9/2002 |
| WO | WO 2006/057361 A1 | | 6/2006 |
| WO | WO 2008/036708 A2 | | 3/2008 |
| WO | WO 2010/051422 A1 | | 5/2010 |
| WO | WO 2010/114028 A1 | | 10/2010 |

OTHER PUBLICATIONS

Japanese Office Action dated Apr. 12, 2013, issued in corresponding Japanese Patent Application No. 2012-541740 (3 pages).

Extended Search report issued in corresponding European Application No. 11837740 on Nov. 20, 2014 (6 pages).

Office Action issued in the corresponding Taiwanese Patent Application on May 13, 2015 (8 pages).

\* cited by examiner (A)

(B)

ENCAPSULATING MATERIAL FOR SOLAR CELL AND SOLAR CELL MODULE

TECHNICAL FIELD

The present invention relates to an encapsulating material for solar cell and a solar cell module.

BACKGROUND ART

With growing concerns about global environmental issues and energy issues, a solar cell has been paid attention as an energy generating means. Such energy is clean with no concerns about drying up. When a solar cell is used in outdoor environment such as on the roof of a building, it is generally used in the form of a solar cell module.

The aforementioned solar cell module is generally produced according to the following procedures. First, a crystalline solar cell element (hereinafter also referred to as the power generating element or cell) formed from polycrystalline silicon, monocrystalline silicon or the like, or a thin film solar cell element obtained by forming an ultra-thin (several micrometers) film made of amorphous silicon or crystalline silicon onto a substrate of glass or the like, is manufactured. Next, in order to obtain a crystalline solar cell module, a protective sheet for a solar cell module (surface protective sheet), an encapsulating material sheet for solar cell, a crystalline solar cell element, an encapsulating material sheet for solar cell and a protective sheet for a solar cell module (back surface protective sheet) are laminated in this order. On the other hand, in order to obtain a thin film solar cell module, a thin film solar cell element, an encapsulating material sheet for solar cell and a protective sheet for a solar cell module (back surface protective sheet) are laminated in this order. Thereafter, a solar cell module is manufactured through a lamination method in which the laminated material is absorbed under vacuum and pressed with heating. Solar cell modules manufactured in this manner are weather-resistant and thus are suitable for use in outdoor environment such as on the roof of a building.

As an encapsulating film material for a solar cell, a film made of an ethylene/vinyl acetate (EVA) copolymer has been widely used because it is excellent in transparency, flexibility and adhesiveness. For example, Patent Document 1 discloses an encapsulating film excellent in both adhesiveness and film-forming properties consisting of a crosslinking agent and an EVA composition containing trimellitate. However, when the EVA composition is used as a constituent material of an encapsulating material for solar cell, there is the risk of possibly affecting the solar cell element by the component such as acetic acid gas and other unwanted gas generated by decomposition of EVA.

On the other hand, there has been proposed the use of a polyolefin based material, particularly an ethylene based material, as an encapsulating film material, because it is also excellent in insulation properties (for example, see Patent Document 2).

Meanwhile, there has also been proposed a resin composition for an encapsulating material for solar cell using an ethylene/α-olefin copolymer excellent in a balance between rigidity and crosslinking properties, and extrusion moldability (for example, see Patent Document 3).

Also, with the recent popularization of solar power generation, solar cell power generation systems have increased in size. In general, in solar cell power generation systems, several to several tens of solar cell modules are connected in series, and in order to decrease transmission loss, and so forth, there is a movement to raise system voltages. For example, small-sized household systems have been operated at 50 V to 500 V, and large-sized systems called mega solar systems have been operated at 600 V to 1000 V. For the outer frames of solar cell modules, aluminum frames and the like are used to retain strength, and so forth, and from the viewpoints of safety, the aluminum frames are often grounded. As a result, between a frame and a solar cell element, and between glass having low electrical resistance (glass which is disposed on the surface of a solar cell module) and a solar cell element, a potential difference is generated.

For example, in case of a solar cell array having a system voltage of 600 V to 1000 V, in a module having the maximum voltage, a potential difference between a frame and a solar cell element becomes the same as the system voltage, that is, 600 V to 1000 V. Also, through the frame, a high voltage is generated even between glass and a solar cell element. In other words, under a situation where photoelectric conversion is being performed, in modules connected in series, potential differences between solar cell elements and frames and potential differences between the solar cell elements and glass increase sequentially from the ground side, and at a place having the largest potential difference, the potential difference in the system voltage is almost maintained. There is a report that due to that usage condition, in a solar cell module having a crystalline power generation element, a potential induced degradation (PID) phenomenon happens such that output power decreases considerably and property degradation occurs.

RELATED DOCUMENT

Patent Document

Patent Document 1: Japanese Laid-open Patent Publication No. 2010-53298
Patent Document 2: Japanese Laid-open Patent Publication No. 2006-210906
Patent Document 3: Japanese Laid-open Patent Publication No. 2010-258439

DISCLOSURE OF THE INVENTION

According to the review by the present inventors, a polyolefin based composition hardly satisfies all the various properties such as transparency, anti-blocking properties and moldability at the time of calender process. The polyolefin based copolymer described in Patent Document 2 has problems such that crosslinking properties are not sufficient and distortion caused by crosslinking is increased. Thus, a glass substrate might possibly be deformed or broken. Furthermore, a resin composition for an encapsulating material for solar cell consisting of an ethylene/α-olefin copolymer described in Patent Document 3 is not sufficient in a balance between electrical properties (Insulation properties) and crosslinking properties (Restraint of generation of gelled material).

The present invention has been accomplished in view of the problems of the prior arts. An object of the present invention is to establish a clear guide for achieving desired properties of an encapsulating material for solar cell containing an ethylene/α-olefin copolymer satisfying specific requirements, and to provide an encapsulating material for solar cell excellent in a balance among general properties such as transparency, flexibility, adhesiveness, heat resistance, appearance, crosslinking properties, electrical properties and calender moldability.

Another object of the present invention is to provide a solar cell module using the encapsulating material for solar cell.

Another object of the present invention is to provide an encapsulating material for solar cell capable of suppressing occurrence of PID, and a solar cell module using that encapsulating material for solar cell.

In order to achieve the above objects, the present inventors have conducted an extensive study and as a result, have found that an encapsulating material for solar cell excellent in a balance among general properties such as transparency, flexibility, adhesiveness, heat resistance, appearance, crosslinking properties, electrical properties and calender moldability is obtained by the use of a specific ethylene/α-olefin copolymer satisfying the predetermined requirements such as the content ratio of ethylene units, density, MFR and shore A hardness. Thus, the present invention has been completed. Furthermore, they have found that crosslinking properties (Restraint of generation of a gelled material) and electrical properties (Insulation properties) are further excellent because the content of the aluminum element satisfies the specific range. Thus, the present invention has been completed.

That is, according to the present invention, there is provided an encapsulating material for solar cell as illustrated below.

[1] An encapsulating material for solar cell containing an ethylene/α-olefin copolymer satisfying the following requirements (a1) to (a4):

(a1) the content ratio of structural units derived from ethylene is from 80 to 90 mol % and the content ratio of structural units derived from α-olefin having 3 to 20 carbon atoms is from 10 to 20 mol %;

(a2) MFR is equal to or more than 2 g/10 minutes and less than 10 g/10 minutes as measured under the conditions of a temperature of 190 degrees centigrade and a load of 2.16 kg in accordance with ASTM D1238;

(a3) the density is from 0.865 to 0.884 g/cm$^3$ as measured in accordance with ASTM D1505; and (a4) the shore A hardness is from 60 to 85 as measured in accordance with ASTM D2240.

[2] The encapsulating material for solar cell according to [1], wherein the encapsulating material for solar cell further satisfies the following requirement (a5):

(a5) the volume resistivity is from $1.0 \times 10^{13}$ to $1.0 \times 10^{18}$ Ω·cm as measured at a temperature of 100 degrees centigrade with an applied voltage of 500 V in accordance with JIS K6911.

[3] The encapsulating material for solar cell according to [1], wherein the ethylene/α-olefin copolymer further satisfies the following requirement (a6):

(a6) the content of aluminum element in the ethylene/α-olefin copolymer is from 10 to 500 ppm.

[4] The encapsulating material for solar cell according to [2], wherein the ethylene/α-olefin copolymer further satisfies the following requirement (a6):

(a6) the content of aluminum element in the ethylene/α-olefin copolymer is from 10 to 500 ppm.

[5] The encapsulating material for solar cell according to any one of [1] to [4], wherein organic peroxide having a one-minute half-life temperature in the range of 100 to 170 degrees centigrade is further contained in an amount of 0.1 to 3 weight parts, based on 100 weight parts of the ethylene/α-olefin copolymer.

[6] The encapsulating material for solar cell according to any one of [1] to [5], wherein the ethylene/α-olefin copolymer is polymerized in the presence of a catalyst for olefin polymerization composed of a metallocene compound, and at least one compound selected from the group consisting of an organic aluminumoxy compound and an organic aluminum compound.

[7] The encapsulating material for solar cell according to any one of [1] to [6], including an ethylene resin composition containing a silane coupling agent in an amount of 0.1 to 5 weight parts, based on 100 weight parts of the ethylene/α-olefin copolymer.

[8] The encapsulating material for solar cell according to [7], wherein the ethylene resin composition further contains at least one kind selected from the group consisting of an ultraviolet absorber, a heat-resistant stabilizer and a hindered amine type light stabilizer in an amount of 0.005 to 5 weight parts, based on 100 weight parts of the ethylene/α-olefin copolymer.

[9] The encapsulating material for solar cell according to [7] or [8], wherein the ethylene resin composition further contains a crosslinking aid in an amount of 0.05 to 5 weight parts, based on 100 weight parts of the ethylene/α-olefin copolymer.

[10] The encapsulating material for solar cell according to any one of [1] to [9], obtained by melt-kneading the ethylene/α-olefin copolymer and an additive and then calender-molding the melt-kneaded mixture at the calender molder in a sheet form.

[11] The encapsulating material for solar cell according to any one of [1] to [10], wherein, for the ethylene/α-olefin copolymer, (a7) the B value determined from the $^{13}$C-NMR spectrum and the following equation (1) is from 0.9 to 1.5, and (a8) the intensity ratio of Tαβ to Tαα (Tαβ/Tαα) in the $^{13}$C-NMR spectrum is equal to or less than 1.5:

$$B \text{ Value} = [P_{OE}]/(2 \times [P_O] \times [P_E]) \tag{1}$$

wherein, in the equation (1), [$P_E$] represents a proportion (molar fraction) of structural units derived from ethylene contained in the ethylene/α-olefin copolymer; [$P_o$] represents a proportion (molar fraction) of structural units derived from α-olefin having 3 to 20 carbon atoms contained in the ethylene/α-olefin copolymer; and [$P_{OE}$] represents a proportion (molar fraction) of an α-olefin/ethylene chain contained in the total dyad chain.

[12] The encapsulating material for solar cell according to any one of [1] to [11], wherein (a9) the molecular weight distribution (Mw/Mn) of the ethylene/α-olefin copolymer is in the range of 1.2 to 3.5 as measured by gel permeation chromatography (GPC).

[13] The encapsulating material for solar cell according to any one of [1] to [12], wherein (a10) the content ratio of chlorine ion of the ethylene/α-olefin copolymer is equal to or less than 2 ppm as detected from an extraction liquid after a treatment of solid-phase extraction by ion chromatography.

[14] The encapsulating material for solar cell according to any one of [1] to [13], wherein (a11) the extracted amount of the ethylene/α-olefin copolymer in methyl acetate is equal to or less than 5.0 weight %.

[15] The encapsulating material for solar cell according to any one of [1] to [14], wherein the material is in a sheet form.

[16] A solar cell module having:
a transparent surface protective member;
a back surface protective member;
a solar cell element; and
an encapsulating layer for encapsulating the solar cell element between the transparent surface protective member and the back surface protective member to be formed by crosslinking the encapsulating material for solar cell according to any one of [1] to [15].

Effect of the Invention

According to the present invention, there is provided an encapsulating material for solar cell excellent in a balance among general properties such as transparency, flexibility, adhesiveness, heat resistance, appearance, crosslinking properties, electrical properties and calender moldability by the use of a specific ethylene/α-olefin copolymer.

According to the present invention, by the use of such an encapsulating material for solar cell, an excellent balance among the aforementioned general properties is achieved, and in addition thereto, it is possible to avoid a trouble such that the encapsulating material is deformed even though the temperature is increased during usage of a solar cell module. It is possible to provide a solar cell module excellent in economic efficiency such as the costs or the like without damaging the appearance of the solar cell.

Furthermore, by the use of an encapsulating material having the aforementioned material properties, it is possible to provide a solar cell module that largely controls occurrence of PID even though a high voltage applied between the frame and the solar cell element in a case of a solar cell array is maintained.

BRIEF DESCRIPTION OF THE DRAWINGS

The above and other objects, features and advantages of the present invention will be more apparent from the following description of certain preferred exemplary embodiments taken in conjunction with the accompanying drawings, in which.

DESCRIPTION OF EMBODIMENTS

Figure 1:
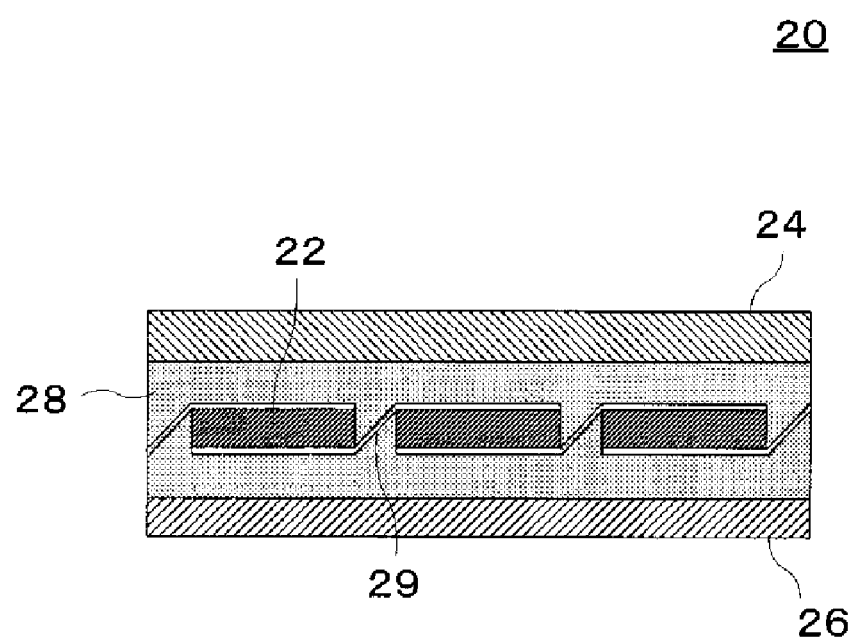
FIG. 1 is a cross sectional view schematically illustrating one exemplary embodiment of a solar cell module of the present invention.

Exemplary embodiments of the present invention will be described below. It should be noted that, "to" represents from "equal to or more than" to "equal to or less than" unless otherwise specifically noticed.

1. Encapsulating Material for Solar Cell

The encapsulating material for solar cell of the present invention contains an ethylene/α-olefin copolymer satisfying the following specific requirements.

Ethylene-α-Olefin Copolymer

The ethylene/α-olefin copolymer used for the encapsulating material for solar cell of the present invention is obtained by copolymerizing ethylene with α-olefin having 3 to 20 carbon atoms. As α-olefin, usually, one α-olefin having 3 to 20 carbon atoms alone can be used, or two or more kinds thereof can be used in combination. Among these, preferable one is α-olefin having equal to or less than 10 carbon atoms, and notably preferable one is α-olefin having 3 to 8 carbon atoms. Concrete examples of the α-olefin include propylene, 1-butene, 1-pentene, 1-hexene, 3-methyl-1-butene, 3,3-dimethyl-1-butene, 4-methyl-1-pentene, 1-octene, 1-decene, 1-dodecene and the like. Among these, preferable ones are propylene, 1-butene, 1-pentene, 1-hexene, 4-methyl-1-pentene and 1-octene from the viewpoint of availability. It should be noted that, the ethylene/α-olefin copolymer may be a random copolymer or a block copolymer, and preferable one is a random copolymer from the viewpoint of flexibility.

Hereinafter, the requirements (a1) to (a4) will be described.

Requirement (a1)

The content ratio of structural units derived from ethylene contained in the ethylene/α-olefin copolymer is from 80 to 90 mol %.

The ratio of structural units derived from α-olefin having 3 to 20 carbon atoms contained in the α-olefin (hereinafter also referred to as the α-olefin units) is from 10 to 20 mol %, preferably from 12 to 20 mol %, more preferably from 12 to 18 mol %, and further preferably from 13 to 18 mol %. In the case where the content ratio of the α-olefin units is less than 10 mol %, crystallization is high so that transparency tends to be lowered. Furthermore, during calender molding, a failure in intrusion of the ethylene/α-olefin copolymer into a resin reservoir (hereinafter, referred to as a bank) between calender rolls occurs or clinging to the calender rolls get worse. For this reason, it is necessary to set a temperature for calender molding to a high temperature, for example, 100° C. or more. Meanwhile, if the temperature for calender molding is high, in a case of kneading organic peroxide into the ethylene/α-olefin copolymer, it is easy for a crosslinking reaction to proceed. Therefore, a gelatinous foreign substance is generated on the sheet of an encapsulating material for solar cell, so that the appearance of the sheet tends to be worsened. Also, if calender molding is performed under high temperature condition, it becomes easy for a silane coupling agent, the organic peroxide, the stabilizer, and like to volatilize. Therefore, adhesiveness, heat resistance, or long-term reliability may be reduced. In addition, the flexibility is lowered, so that a solar cell element are cracked during lamination molding of a solar cell module or thin film electrodes are cracked in some cases.

Meanwhile, when the content ratio of the α-olefin units is more than 20 mol %, since a resin composition is sticky, during calender molding, it becomes easy for a sheet to stick to the surfaces of the calender rolls. For this reason, it tends to be more difficult to peel the sheet off the calender rolls and obtain a sheet made of the encapsulating material for solar cell and having a constant thickness. In addition, the sheet becomes sticky and is thus blocked, so that feeding property of the sheet tends to be worsened. Furthermore, the crosslinking becomes insufficient, so that there is the risk of lowering heat resistance.

Requirement (a2)

The melt flow rate (MFR) of the ethylene/α-olefin copolymer is equal to or more than 2 g/10 minutes and less than 10 g/10 minutes, preferably from 2 to 9.5 g/10 minutes, and more preferably from 2.5 to 9.5 g/10 minutes as measured under the conditions of a temperature of 190 degrees centigrade and a load of 2.16 kg in accordance with ASTM D1238. MFR of the ethylene/α-olefin copolymer can be adjusted by controlling the polymerization temperature and polymerization pressure during the polymerization reaction to be described later, and the molar fraction of the monomer concentration of ethylene and α-olefin to hydrogen concentration in the polymerization system.

If the MFR is less than 2 g/10 minutes, the elastic modulus of the resin composition containing the ethylene/α-olefin copolymer becomes high. For this reason, during calender molding, the number of times of kneading for uniformly dispersing various additives in the resin composition increases, and thus productivity is lowered. Also, the scorch property of the resin composition becomes high such that it becomes easy for the resin composition to gelate. Therefore, gelationous substances may create irregularities on the sheet surface which deteriorate the appearance in some cases.

Moreover, application of a voltage to the sheet containing gelationous substances causes cracks around the gelationous substances inside the sheet, thus reducing the dielectric breakdown resistance. Furthermore, moisture permeation becomes likely to occur at the gelationous substances interface, thus increasing moisture permeability. Also, since the elastic modulus is high, in some cases, it is difficult to obtain a thin sheet or to control the thickness. Further, irregularities formed on the sheet surface reduce its adhesion to glass, a solar cell element, an electrode and a backsheet during the lamination process of a solar cell module. Therefore, in some cases, adhesion is insufficient, or the solar cell element is broken.

Meanwhile, if the MFR is 10 g/10 minute or more, the molecular weight is lowered and the elastic modulus is also lowered. As a result, the resin composition is attached to the calender roll surfaces or peeling becomes difficult. Therefore, it tends to be more difficult to form a sheet having a constant thickness. Also, in some cases, a sheet does not cling to only one calender roll but dispersively clings to two calender rolls (hereinafter, referred to as "tearing"), or drops down from the calender rolls by its own weight. Further, since the resin composition is not chewy, it tends to be more difficult to form a sheet having a thickness such as 0.3 mm or more. Furthermore, the crosslinking property (particularly, a crosslinking rate) during the lamination process of a solar cell module is lowered, such that it is impossible to obtain a sufficient crosslinked body, and the heat resistance tends to be lowered.

Requirement (a3)

The density of the ethylene/α-olefin copolymer is from 0.865 to 0.884 g/cm$^3$, preferably from 0.866 to 0.883 g/cm$^3$, more preferably from 0.866 to 0.880 g/cm$^3$, and further preferably from 0.867 to 0.880 g/cm$^3$ as measured in accordance with ASTM D1505. The density of the ethylene/α-olefin copolymer may be adjusted by a balance between the content ratio of ethylene units and the content ratio of α-olefin units. Namely, when the content ratio of ethylene units is increased, crystallinity is increased. Thus, an ethylene/α-olefin copolymer with high density can be obtained. On the other hand, when the content ratio of ethylene units is decreased, crystallinity is lowered. Thus, an ethylene/α-olefin copolymer with low density can be obtained.

In the case where the density of the ethylene/α-olefin copolymer exceeds 0.884 g/cm$^3$, crystallinity is increased so that transparency tends to be lowered. Furthermore, the intrusion property of the ethylene/α-olefin copolymer into the bank during the calender molding is lowered, or clinging to the calender rolls becomes insufficient. For this reason, it is necessary to perform the calender molding at a high temperature, for example, 100 degrees centigrade or more, and in a case of kneading the organic peroxide into the ethylene/α-olefin copolymer, it is easy for a crosslinking reaction to proceed. Therefore, a gelatinous foreign substance is generated on the sheet of an encapsulating material for solar cell, so that the appearance of the sheet tends to be worsened. Also, if calender molding is performed under high temperature condition, it becomes easy for the silane coupling agent, the organic peroxide, the stabilizer, and like to volatilize. Therefore, adhesiveness, heat resistance, or long-term reliability may be reduced. Also, the flexibility is lowered, so that cells as a solar cell element are broken during lamination molding of a solar cell module or thin film electrodes are cracked in some cases.

On the other hand, when the density of the ethylene/α-olefin copolymer is less than 0.865 g/cm$^3$, since a resin composition is sticky, during calender molding, it becomes easy for a sheet to stick to the surfaces of the calender rolls. Therefore, it tends to be more difficult to peel the sheet off the calender rolls and obtain a sheet made of the encapsulating material for solar cell and having a constant thickness. Also, the sheet becomes sticky and is thus blocked, so that feeding property of the sheet tends to be worsened. Also, the crosslinking becomes insufficient, so that there is the risk of lowering heat resistance.

Requirement (a4)

The shore A hardness of the ethylene/α-olefin copolymer is from 60 to 85, preferably from 62 to 83, more preferably from 62 to 80, and further preferably from 65 to 80 as measured in accordance with ASTM D2240. The shore A hardness of the ethylene/α-olefin copolymer may be adjusted by controlling the content ratio of ethylene units and the density of the ethylene/α-olefin copolymer to the numerical ranges to be described the aforementioned. In other words, in case of an ethylene/α-olefin copolymer with high content ratio of ethylene units and high density, the shore A hardness is increased. On the other hand, in case of an ethylene/α-olefin copolymer with low content ratio of ethylene units and low density, the shore A hardness is lowered.

When the shore A hardness is less than 60, an ethylene content decreases (an α-olefin content increases). Therefore, during calender molding, it becomes easy for a sheet to stick to the surfaces of the calender rolls. Therefore, it tends to be more difficult to peel the sheet off the calender rolls and obtain a sheet made of the encapsulating material for solar cell and having a constant thickness. Also, the sheet becomes sticky and is thus blocked, so that feeding property of the sheet tends to be worsened. Also, the crosslinking becomes insufficient, so that there is the risk of lowering heat resistance.

On the other hand, in the case where the shore A hardness exceeds 85, crystallinity is high so that transparency tends to be lowered. Furthermore, the intrusion property of the ethylene/α-olefin copolymer into the bank during calender molding is lowered, or clinging to the calender rolls becomes insufficient. For this reason, it is necessary to perform the calender molding at a high temperature, for example, 100 degrees centigrade or more, and in a case of kneading the organic peroxide into the ethylene/α-olefin copolymer, it is easy for a crosslinking reaction to proceed. Therefore, a gelatinous foreign substance is generated on the sheet of an encapsulating material for solar cell, so that the appearance of the sheet tends to be worsened. Also, if calender molding is performed under high temperature condition, it becomes easy for the silane coupling agent, the organic peroxide, the stabilizer, and like to volatilize. Therefore, adhesiveness, heat resistance, or long-term reliability may be reduced. Also, the flexibility is lowered, so that cells as a solar cell element are cracked during lamination molding of a solar cell module or thin film electrodes are cracked in some cases.

Meanwhile, it is preferable that the encapsulating material for solar cell of the present invention further satisfies the following requirements (a5) to (a11).

Requirement (a5)

For the encapsulating material for solar cell of the present invention, the volume resistivity is preferably from $1.0 \times 10^{13}$ to $1.0 \times 10^{18}$ Ω·cm as measured at a temperature of 100 degrees centigrade with an applied voltage of 500V in accordance with JIS K6911. The encapsulating material for solar cell with small volume resistivity tends to have a characteristic of easily causing PID. Furthermore, during use of a solar cell module, at a period of time when sunlight is irradiated, the module temperature may become equal to or more than 70 degrees centigrade. Therefore, from the viewpoint of long-term reliability, it is necessary to notice volume resistivity under high temperature condition, rather than volume resistivity at a normal temperature (23 degrees centigrade) having been reported, and volume resistivity at a temperature of 100 degrees centigrade becomes important.

The volume resistivity as measured under the above conditions is preferably from $1.0\times10^{14}$ to $1.0\times10^{18}$ Ω·cm, further preferably from $5.0\times10^{14}$ to $1.0\times10^{18}$ Ω·cm, and most preferably from $1.0\times10^{15}$ to $1.0\times10^{18}$ Ω·cm.

In the case where the volume resistivity as measured under the above conditions is less than $1.0\times10^{18}$ Ω·cm, in a constant temperature/humidity test at a temperature of 85 degrees centigrade and 85% rh, a PID phenomenon tends to occur in a short period of time of about 1 day. In the case where the volume resistivity exceeds $1.0\times10^{18}$ Ω·cm, static electricity is applied to the sheet of the encapsulating material for solar cell, dust is easily attached, and dust is entrained into the solar cell module, so that the power generation efficiency and long-term reliability tend to be lowered.

Also, the volume resistivity of $5.0\times1014$ Ω·cm or more makes it possible to suppress the PID phenomenon from occurring in a solar cell module for a longer period of time, and thus is preferable. For example, even in a constant temperature/humidity test at a temperature of 85 degrees centigrade and 85% rh, it is possible to confirm suppression of occurrence of the PID phenomenon.

The volume resistivity is measured after molding the encapsulating material for solar cell into a sheet, crosslinking the sheet with a vacuum laminator, a hot press, a crosslinking furnace or the like, and processing it into a smooth sheet. Also, the volume resistivity of the sheet in a solar cell module laminate is measured by removing additional layers.

Requirement (a6)

The content of aluminum element (hereinafter referred to as Al) (amount of residue) contained in the ethylene/α-olefin copolymer is preferably from 10 to 500 ppm, more preferably from 20 to 400 ppm, and further preferably from 20 to 300 ppm. The standard of ppm is weight. The Al content is dependent on the concentration of an organic aluminumoxy compound or an organic aluminum compound which is added in the polymerization process of the ethylene/α-olefin copolymer.

The ethylene/α-olefin copolymer can be produced using a metallocene catalyst composed of a metallocene compound, and at least one compound selected from the group consisting of an organic aluminumoxy compound and an organic aluminum compound. In reducing an Al content in the ethylene/α-olefin copolymer (for example, to less than 10 ppm), it is necessary only to reduce the amount of organic aluminumoxy compound or organic aluminum compound in the metallocene catalyst. However, if the amount of organic aluminumoxy compound or organic aluminum compound in the metallocene catalyst is excessively small, the metallocene compound is not sufficiently activated. For this reason, it is necessary to further add a "compound which reacts with the metallocene compound to form ion pairs" in the metallocene catalyst. On the other hand, if the "compound which forms ion pairs" remains in the ethylene/α-olefin copolymer, the residue tends to degrade the electrical properties at a high temperature such as 100 degrees centigrade.

Therefore, in the case of producing the ethylene/α-olefin copolymer using the metallocene catalyst, it is preferable to sufficiently add at least one compound selected from the group consisting of the organic aluminumoxy compound and the organic aluminum compound in the metallocene catalyst such that the residual amount of Al in the ethylene/α-olefin copolymer becomes 10 ppm or more.

Also, the ethylene/α-olefin copolymer can be produced by a catalyst system using a known Ziegler-Natta catalyst and an organic aluminum compound. In this case, in order to reduce the Al content, it is necessary to carry out decalcification with acid or alkali. If decalcification is carried out, it is easy for the acid or alkali to remain in the obtained ethylene/α-olefin copolymer, and the residual acid or alkali tends to cause corrosion of electrodes. Also, due to the necessity of the decalcification process, the production costs are increased. Therefore, it is preferable that the Al content should be equal to or more than 10 ppm.

On the other hand, in the case where the Al content exceeds 500 ppm, a crosslinking reaction proceeds in a calender molder and a gelatinous foreign substance is generated on the sheet of an encapsulating material for solar cell, so that the appearance of the sheet tends to be worsened.

As described above, as a method of controlling the amount of aluminum element contained in the ethylene/α-olefin copolymer, for example, the aluminum element contained in the ethylene/α-olefin copolymer may be controlled by adjusting the concentration in the production step of an organic aluminumoxy compound (II-1) and an organic aluminum compound (II-3) described in the method for producing an ethylene/α-olefin copolymer to be described later, or the polymerization activity of the metallocene compound under the production conditions of the ethylene/α-olefin copolymer.

Requirement (a7)

The B value of the ethylene/α-olefin copolymer determined from the $^{13}$C-NMR spectrum and the following equation (1) is preferably from 0.9 to 1.5, more preferably from 0.9 to 1.3, further preferably from 0.95 to 1.3, particularly preferably from 0.95 to 1.2, and the most preferably from 1.0 to 1.2. The B value can be adjusted by changing a polymerization catalyst during polymerization of the ethylene/α-olefin copolymer. More specifically, by the use of a metallocene compound to be described later, it is possible to obtain an ethylene/α-olefin copolymer with the B value in the above numerical range:

$$B \text{ Value} = [P_{OE}]/(2\times[P_O]\times[P_E]) \quad (1)$$

wherein, in the equation (1), $[P_E]$ represents the molar fraction of structural units derived from ethylene contained in the ethylene/α-olefin copolymer; $[P_O]$ represents the molar fraction of structural units derived from α-olefin having 3 to 20 carbon atoms contained in the ethylene/α-olefin copolymer; and $[P_{OE}]$ represents the molar fraction of an α-olefin/ethylene chain contained in the total dyad chain.

The B value is an index which represents the distribution of the ethylene units and α-olefin units in the ethylene/α-olefin copolymer. The B value is determined according to the procedures reported by J. C. Randall (Macromolecules, 15, 353 (1982)) and J. Ray (Macromolecules, 10, 773 (1977)).

A higher B value indicates that the copolymer contains less ethylene units or less block chain units of the α-olefin copolymer, has a more uniform distribution of ethylene units and α-olefin units, and has a narrower composition distribution of a copolymer rubber. It should be noted that, the B value of less than 0.9 indicates that the ethylene/α-olefin copolymer has a wider composition distribution. Particularly, block chain units of ethylene units increase, the degree of crystallinity is high, and transparency is reduced. Furthermore, the intrusion property of the ethylene/α-olefin copolymer into the bank during calender molding is lowered, or clinging to the calender rolls becomes insufficient. For this reason, it is necessary to perform the calender molding at a high temperature, for example, 100 degrees centigrade or more, and in a case of kneading the organic peroxide into the ethylene/α-olefin copolymer, it is easy for a crosslinking reaction to proceed. Therefore, a gelatinous foreign substance is generated on the sheet of an encapsulating material for solar cell, so that the appearance of the sheet tends to be worsened. Also, if calender molding is performed under high temperature condition, it becomes easy for the silane coupling agent, the organic peroxide, the stabilizer, and like to volatilize. Therefore, adhesiveness, heat resistance, or long-term reliability may be reduced. Further, the flexibility is lowered, so that solar cell elements are broken during lamination molding of a solar cell module, or thin film electrodes are cracked in some cases.

Requirement (a8)

The intensity ratio of Tαβ to Tαα (Tαβ/Tαα) of the ethylene/α-olefin copolymer in the $^{13}$C-NMR spectrum is preferably equal to or less than 1.5, further preferably equal to or less than 1.2, particularly preferably equal to or less than 1.0, and most preferably less than 0.7. Tαβ/Tαα can be adjusted by changing a polymerization catalyst during polymerization of the ethylene/α-olefin copolymer. More specifically, it is possible to obtain an ethylene/α-olefin copolymer having Tαβ/Tαα in the aforementioned numerical range by the use of a metallocene compound to be described later.

Tαα and Tαβ in the $^{13}$C-NMR spectrum are each a peak intensity of $CH_2$ in the structural unit derived from α-olefin having equal to or more than 3 carbon atoms. More specifically, they mean peak intensities each of two kinds of $CH_2$ which are different in positions to the tertiary carbon as shown in the following manner.

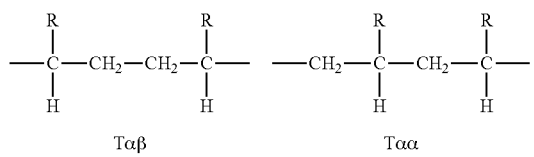

Tαβ/Tαα can be determined in the following manner. A $^{13}$C-NMR spectrum of the ethylene/α-olefin copolymer is measured using an NMR measuring apparatus (for example, product name: JEOL-GX270 manufactured by JEOL Ltd.). The measurement is carried out using a mixed solution of hexachlorobutadiene and d6-benzene (hexachlorobutadiene/d6-benzene=2/1 (volume ratio)) adjusted to a sample concentration of 5 weight %, under the conditions of 67.8 MHz, 25 degrees centigrade and d6-benzene (128 ppm) basis. The $^{13}$C-NMR spectrum thus measured is analyzed in accordance with proposals of Lindemann Adams (Analysis Chemistry, 43, p1245 (1971)) and J. C. Randall (Review Macromolecular Chemistry Physics, C29, 201 (1989)) to determine a Tαβ/Tαα intensity ratio.

The intensity ratio of Tαβ to Tαα (Tαβ/Tαα) in the $^{13}$C-NMR of the ethylene/α-olefin copolymer represents the coordination state of α-olefin to a polymerization catalyst during the polymerization reaction. When the α-olefin is coordinated to a polymerization catalyst in a Tαβ type, substituent groups of α-olefin hinder the polymerization growth reaction of the polymer chain, and growth of the low molecular weight component tends to be promoted. Therefore, during calender molding, it becomes easy for a sheet to stick to the surfaces of the calender rolls. For this reason, it tends to be more difficult to peel the sheet off the calender rolls and obtain a sheet made of the encapsulating material for solar cell and having a constant thickness. Also, the sheet becomes sticky and is thus blocked, so that feeding property of the sheet tends to be worsened. Further, the crosslinking becomes insufficient, so that there is the risk of lowering heat resistance. Furthermore, since the low molecular weight component is bled on the sheet surface, adhesion is hindered and adhesiveness is lowered.

Requirement (a9)

For the ethylene/α-olefin copolymer, the molecular weight distribution (Mw/Mn) represented by a ratio of the weight average molecular weight (Mw) to the number average molecular weight (Mn) is preferably in the range of 1.2 to 3.5, more preferably in the range of 1.7 to 3.0, further preferably in the range of 1.7 to 2.7, and particularly preferably in the range of 1.9 to 2.4, as measured by gel permeation chromatography (GPC). The molecular weight distribution (Mw/Mn) of the ethylene/α-olefin copolymer can be adjusted by using a metallocene compound to be described later during polymerization.

In order to make Mw/Mn less than 1.2, living polymerization of the ethylene/α-olefin copolymer is necessary, and the catalyst activity is not achieved. Or, it is necessary to separate the low molecular weight component and the high molecular weight component of the ethylene/α-olefin copolymer obtained in a polymerization method known in the art, so that the production costs are increased. The calender molding temperature width is also narrowed, so that a sheet having a uniform thickness is hardly formed and the sheet tends to be hardly molded.

On the other hand, in the case where Mw/Mn exceeds 3.5, since the low molecular weight component is increased, the sheet becomes sticky and is thus blocked. So, feeding property of the sheet tends to be worsened. Therefore, during calender molding, it becomes easy for a sheet to stick to the surfaces of the calender rolls. For this reason, it tends to be more difficult to peel the sheet off the calender rolls and obtain a sheet made of the encapsulating material for solar cell and having a constant thickness. Further, tearing occurs in some cases. Also, the sheet becomes sticky and is thus blocked, so that feeding property of the sheet tends to be worsened. Furthermore, the crosslinking becomes insufficient, so that there is the risk of lowering heat resistance. Furthermore, since the low molecular weight component is bled on the sheet surface, adhesion is hindered and adhesiveness is lowered.

The ratio (Mw/Mn) of the weight average molecular weight (Mw) to the number average molecular weight (Mn) is measured using gel permeation chromatograph (product name: Alliance GPC-2000 manufactured by Waters Co., Ltd.) in the following manner. Separation columns are two TSKgel GMH6-HT columns and two TSKgel GMH6-HTL columns. The columns have an internal diameter of 7.5 mm and a length of 300 mm. The column temperature is 140 degrees centigrade. The mobile phase is o-dichlorobenzene (a product of Wako Pure Chemical Industries, Ltd.), and 0.025 weight % of BHT (a product of Takeda Pharmaceutical Co., Ltd.) is used therewith as an antioxidant. The mobile phase is passed at a rate of 1.0 ml/minute. The sample concentration is 15 mg/10 ml and the amount of sample injected is 500 μl. A differential refractometer is used as a detector. For molecular weights of Mw≤1,000 and Mw≥4×10$^6$, polystyrenes manufactured by Tosoh Corporation are used as standards. For molecular weights of 1,000≤Mw≤4×10$^6$, polystyrenes manufactured by Pressure Chemical Co., Ltd. are used as standards. The molecular weight is a value in terms of the ethylene/α-olefin copolymer for respective α-olefins using a universal calibration curve.

Requirement (a10)

The content ratio of chlorine ion of the ethylene/α-olefin copolymer is preferably equal to or less than 2 ppm, further preferably equal to or less than 1.5 ppm, and particularly preferably equal to or less than 1.2 ppm, as detected from an extract subjected to solid-phase extraction by ion chromatography. The ppm is weight-based. The content ratio of chlorine ion can be adjusted by controlling the structure and polymerization conditions of a metallocene compound to be described later. That is, the amount of catalyst residue in the ethylene/α-olefin copolymer is reduced by increasing the polymerization activity of the catalyst, so that it is possible to obtain an ethylene/α-olefin copolymer with the content ratio of chlorine ion in the above numerical range.

In the case where the content ratio of chlorine ion in the ethylene/α-olefin copolymer exceeds 2 ppm, electrodes consisting of silver or the like are corroded, so that long-term reliability of the solar cell module is lowered in some cases. It is possible to obtain an ethylene/α-olefin copolymer substantially free from chlorine ion by the use of a metallocene compound without containing a chlorine atom.

The content ratio of chlorine ion in the ethylene/α-olefin copolymer can be measured with an ion chromatograph apparatus (product name: ICS-2000 manufactured by Dionex Corporation) using an extract obtained by accurately weighing about 10 g of the ethylene/α-olefin copolymer in a glass container that is sterilized and washed using an autoclave or the like, adding 100 ml of ultra pure water for tightly sealing the container, and then carrying out ultrasonic wave (38 kHz) extraction at a normal temperature for 30 minutes.

Requirement (a11)

The extracted amount of the ethylene/α-olefin copolymer in methyl acetate is preferably equal to or less than 5.0 weight %, more preferably equal to or less than 4.0 weight %, further preferably equal to or less than 3.5 weight %, and particularly preferably equal to or less than 2.0 weight %. A large amount of extraction in methyl acetate means that a lot of low molecular weight component is contained in the ethylene/α-olefin copolymer, and the molecular weight distribution or the composition distribution is broad. Therefore, it is possible to obtain an ethylene/α-olefin copolymer with a small amount of extraction in methyl acetate by controlling the polymerization conditions using a metallocene compound to be described later.

For example, if the metallocene compound with reduced polymerization activity by shortening the polymerization time in a polymerization reactor is taken out of the polymerization system, generation of the low molecular weight component is suppressed. In the case where the extracted amount in methyl acetate by the Soxhlet extraction method exceeds 5.0 weight %, the sheet becomes sticky and is thus blocked, so that feeding property of the sheet tends to be worsened. It has been known that, in general, when the molecular weight distribution (Mw/Mn) becomes wide, the composition distribution also becomes wide. Therefore, during calender molding, it becomes easy for a sheet to stick to the surfaces of the calender rolls. For this reason, it tends to be more difficult to peel the sheet off the calender rolls and obtain a sheet made of the encapsulating material for solar cell and having a constant thickness. Furthermore, the crosslinking becomes insufficient, so that there is the risk of lowering heat resistance. Furthermore, since the low molecular weight component is bled on the sheet surface, adhesion is hindered and adhesiveness is lowered.

The extracted amount of the copolymer in methyl acetate is calculated from the weight differences in the ethylene/α-olefin copolymer before and after extraction by accurately weighing about 10 g of the ethylene/α-olefin copolymer, using an organic solvent as a poor solvent of the ethylene/α-olefin copolymer having a low boiling point such as methyl acetate, methyl ethyl ketone or the like, and carrying out Soxhlet extraction at a temperature of equal to or more than the boiling point of each solvent, or the amount of residue by volatilizing an extraction solvent.

Melting Peak

The melting peak of the ethylene/α-olefin copolymer is present preferably in the range of 30 to 90 degrees centigrade, further preferably in the range of 33 to 90 degrees centigrade, and particularly preferably in the range of 30 to 88 degrees centigrade, as measured by differential scanning calorimetry (DSC). When the melting peak exceeds 90 degrees centigrade, the degree of crystallinity is high and the transparency is reduced. Further, the intrusion property of the ethylene/α-olefin copolymer into the bank during the calender molding is lowered, or clinging to the calender rolls becomes insufficient. For this reason, it is necessary to perform the calender molding at a high temperature, for example, 100 degrees centigrade or more, and in a case of kneading the organic peroxide into the ethylene/α-olefin copolymer, it is easy for a crosslinking reaction to proceed. Therefore, a gelatinous foreign substance is generated on the sheet of an encapsulating material for solar cell, so that the appearance of the sheet tends to be worsened. Also, if calender molding is performed under high temperature condition, it becomes easy for the silane coupling agent, the organic peroxide, the stabilizer, and like to volatilize. Therefore, adhesiveness, heat resistance, or long-term reliability may be reduced. Further, the flexibility is lowered, so that solar cell elements are broken during lamination molding of a solar cell module, or thin film electrodes are cracked in some cases. When the melting peak is less than 30 degrees centigrade, during calender molding, it becomes easy for a sheet to stick to the surfaces of the calender rolls. For this reason, it tends to be more difficult to peel the sheet off the calender rolls and obtain a sheet made of the encapsulating material for solar cell and having a constant thickness. Also, the sheet becomes sticky and is thus blocked, so that feeding property of the sheet tends to be worsened. Furthermore, the crosslinking becomes insufficient, so that there is the risk of lowering heat resistance.

MFR10/MFR2

The value of a ratio MFR10/MFR2 of a melt flow rate (MFR2) measured under the conditions of a temperature of 190 degrees centigrade and a load of 2.16 kg in accordance with ASTM D1238 and a melt flow rate (MFR10) measured under the conditions of a temperature of 190 degrees centigrade and a load of 10 kg in accordance with ASTM D1238 is preferably 5.63 or more, more preferably, 6.0 or more, and further preferably 6.1 or more. The value of MFR10/MFR2 is an indicator of the long-chain branching level in the ethylene/α-olefin copolymer. When the value of MFR10/MFR2 is less than 5.63, long-chain branching in the ethylene/α-olefin copolymer is less, and the elastic modulus is lowered. For this reason, during peeling from the calender roll surfaces, a sheet tends to excessively stretch, such that it is difficult to form a sheet having a constant thickness. Also, tearing occurs in some cases. Further, since the resin composition is not chewy, it tends to be more difficult to form a sheet having a thickness such as 0.3 mm or more.

Method for Producing Ethylene/α-olefin Copolymer The ethylene/α-olefin copolymer can be produced using various metallocene compounds described below as a catalyst. As the metallocene compound, there may be used metallocene compounds as disclosed, for example, in Japanese Laid-open Patent Publication No. 2006-077261, Japanese Laid-open Patent Publication No. 2008-231265, Japanese Laid-open Patent Publication No. 2005-314680 and the like. However, metallocene compounds which have different structures than those of the metallocene compounds disclosed in these Patent Documents may also be used, or two or more metallocene compounds may be used in combination.

Preferable examples of the polymerization reaction using a metallocene compound include the following aspects.

There are provided one or more monomers selected from ethylene, α-olefin and the like in the presence of an olefin polymerization catalyst composed of a metallocene compound (I), and at least one compound (II) selected from the group consisting of an organic aluminumoxy compound (II-1), a compound (II-2) that forms ion pairs by reaction with the aforementioned metallocene compound (I) and an organic aluminum compound (II-3) (also referred to as the catalytic promoter).

As the organic aluminumoxy compound (II-1), the compound (II-2) that forms ion pairs by reaction with the aforementioned metallocene compound (I) and the organic aluminum compound (II-3), there may be used metallocene compounds as disclosed, for example, in Japanese Laid-open Patent Publication No. 2006-077261, Japanese Laid-open Patent Publication No. 2008-231265, Japanese Laid-open Patent Publication No. 2005-314680 and the like. However, metallocene compounds which have different structures than those of the metallocene compounds disclosed in these Patent Documents may also be used. These compounds may be individually charged into a polymerization atmosphere or may be previously contacted with one another before being charged into the polymerization atmosphere. Furthermore, the metallocene compounds may be loaded on an inorganic oxide microparticle carrier such as that disclosed in Japanese Laid-open Patent Publication No. 2005-314680.

Preferably, the ethylene/α-olefin copolymer is produced without actually using the compound (II-2) that forms ion pairs by reaction with the aforementioned metallocene compound (I). The reason is that if the compound (II-2) that forms ion pairs by reaction with the aforementioned metallocene compound (I) remains in the ethylene/α-olefin copolymer, the residue tends to deteriorate the electrical properties.

Also, the ethylene/α-olefin copolymer can be produced by a catalyst system using a known Ziegler-Natta catalyst and the organic aluminum compound (II-3). In this case, the produced resin is decalcified with acid or the like so as to reduce a metal component or ion content in the resin, whereby it is possible to obtain an ethylene/α-olefin copolymer having superior electrical properties. However, in the ethylene/α-olefin copolymer obtained by that method, it is easy for the acid or alkali to remain, and the residual acid or alkali tends to cause corrosion of electrodes. Also, since the decalcification process is carried out, the cost of the ethylene/α-olefin copolymer also increases.

Therefore, it is preferable to produce an ethylene/α-olefin copolymer by polymerization in the presence of an olefin polymerization catalyst composed of the metallocene compound (I), and at least one compound selected from the group consisting of the organic aluminumoxy compound (II-1) and the organic aluminum compound (II-3).

The ethylene/α-olefin copolymer can be polymerized by gas-phase polymerization known in the art or by liquid-phase polymerization such as slurry polymerization, solution polymerization or the like. Polymerization is preferably liquid-phase polymerization such as solution polymerization or the like. When an ethylene/α-olefin copolymer is produced by copolymerizing ethylene with α-olefin having 3 to 20 carbon atoms using the aforementioned metallocene compound, the metallocene compound (I) is usually used in an amount of $10^{-9}$ to $10^{-1}$ mol and preferably $10^{-8}$ to $10^{-2}$ mol, per 1 L reaction volume.

The compound (II-1) is used in an amount such that the molar ratio of the compound (II-1) to the total transition metal atoms (M) in the metallocene compound (I), [(II-1)/M], usually ranges from 1 to 10,000 and preferably from 10 to 5,000. The compound (II-2) is used in an amount such that the molar ratio of the compound (II-2) to the total transition metal atoms (M) in the metallocene compound (I), [(II-2)/M], usually ranges from 0.5 to 50 and preferably from 1 to 20. The compound (II-3) is used in an amount of usually 0 to 5 mmol and preferably about 0 to 2 mmol, per 1 L polymerization reaction volume.

In the case of solution polymerization, an ethylene/α-olefin copolymer with high comonomer content, a narrow composition distribution and a narrow molecular weight distribution can be efficiently produced by copolymerization of ethylene with α-olefin having 3 to 20 carbon atoms in the presence of the aforementioned metallocene compound. As to the charging ratio of ethylene to α-olefin having 3 to 20 carbon atoms (by mol), ethylene/α-olefin is usually from 10/90 to 99.9/0.1, preferably from 30/70 to 99.9/0.1, and further preferably from 50/50 to 99.9/0.1.

Examples of the α-olefin having 3 to 20 carbon atoms include straight-chain or branched α-olefins, such as, propylene, 1-butene, 2-butene, 1-pentene, 3-methyl-1-butene, 1-hexene, 4-methyl-1-pentene, 3-methyl-1-pentene, 1-octene, 1-decene, 1-dodecene and the like. Also, examples of α-olefin which is used in the solution polymerization include polar group-containing olefins. Examples of the polar group-containing olefin include α,β-unsaturated carboxylic acids such as acrylic acid, methacrylic acid, fumaric acid, maleic anhydride, and metal salts such as sodium salts thereof; α,β-unsaturated carboxylic acid esters such as methyl acrylate, ethyl acrylate, n-propyl acrylate, methyl methacrylate, ethyl methacrylate and the like; vinyl esters such as vinyl acetate, vinyl propionate and the like; and unsaturated glycidyls such as glycidyl acrylate, glycidyl methacrylate and the like. High-temperature solution polymerization can also be proceeded under the coexistence of an aromatic vinyl compound, for example, styrenes such as styrene, o-methylstyrene, m-methylstyrene, p-methylstyrene, o,p-dimethylstyrene, methoxystyrene, vinyl benzoate, vinyl methyl benzoate, vinyl benzyl acetate, hydroxystyrene, p-chlorostyrene, divinylbenzene and the like; 3-phenylpropylene, 4-phenylpropylene, α-methylstyrene and the like in a reaction system. Among the aforementioned α-olefins, preferably used are propylene, 1-butene, 1-hexene, 4-methyl-1-pentene and 1-octene. In the solution polymerization, cyclic olefins having 3 to 20 carbon atoms such as cyclopentene, cycloheptene, norbornene, 5-methyl-2-norbornene and the like may be used in combination.

"Solution polymerization" is a generic term used to refer to a method of polymerization in which a polymer is dissolved in an inert hydrocarbon solvent to be described later. The polymerization temperature in the solution polymerization is usually from 0 to 200 degrees centigrade, preferably from 20 to 190 degrees centigrade, and further preferably from 40 to 180 degrees centigrade. In the solution polymerization, the polymerization temperature of less than 0 degree centigrade is not practical in terms of productivity, because at such a temperature level, the polymerization activity remarkably drops and heat of polymerization is hardly removed. The polymerization temperature exceeding 200 degrees centigrade is not practical in terms of productivity, because at such a temperature level, the polymerization activity remarkably drops.

The polymerization pressure is usually from normal pressure to 10 MPa (gauge pressure) and preferably from normal pressure to 8 MPa (gauge pressure). Copolymerization can be carried out in a batchwise, semi-continuous or continuous process. The reaction time (average residence time when a copolymerization reaction is carried out in a continuous process) varies depending on the reaction conditions such as catalyst concentration, polymerization temperature or the like, and can be suitably selected. However, it is usually from 1 minute to 3 hours and preferably from 10 minutes to 2.5 hours. Furthermore, polymerization can also be carried out in two or more stages with different reaction conditions. The molecular weight of the obtained ethylene/α-olefin copolymer can also be adjusted by changing hydrogen concentration in the polymerization system or polymerization temperature. Moreover, the molecular weight can also be adjusted by changing the amount of the compound (II) in use. When hydrogen is to be added, an appropriate added amount is from about 0.001 to 5,000 NL per 1 kg of the ethylene/α-olefin copolymer to be produced. The vinyl group and vinylidene group present in the terminal of molecules of the ethylene/α-olefin copolymer to be produced can be adjusted by increasing the polymerization temperature or reducing the added amount of hydrogen as much as possible.

Also, it is considered that if molecular chains (macromonomer) with terminal vinyl groups generated by a β-hydrogen elimination reaction are reinserted, a long-chain branching structure in an ethylene based compound is generated. Therefore, it is considered that in a case of coordination polymerization like the following embodiment, the value of MFR10/MFR2 of the obtained ethylene/α-olefin copolymer varies according to a macromonomer concentration and an ethylene concentration. For this reason, a change in the ratio of the macromonomer concentration and the ethylene concentration ([macromonomer]/[ethylene]) in a solution makes it possible to control the MFR10/MFR2 in the ethylene/α-olefin copolymer. In general, when the value of [macromonomer]/[ethylene] is large, a long-chain branching amount in the ethylene/α-olefin copolymer tends to increase. Meanwhile, when the value of [macromonomer]/[ethylene] is small, the long-chain branching amount in the ethylene/α-olefin copolymer tends to decrease. As a specific method for controlling the value of [macromonomer]/[ethylene] in the solution, the following methods such as methods [1] to [4] can be exemplified.

[1] Polymerization Temperature

As a polymerization temperature lowers, it becomes more difficult to initiate the β-hydrogen elimination reaction. For this reason, if the polymerization temperature is lowered, the value of [macromonomer]/[ethylene] decreases, and the value of MFR10/MFR2 of the ethylene/α-olefin copolymer decreases.

[2] Polymer Concentration

If a polymer concentration in the solution is reduced, the macromonomer concentration also relatively decreases. For this reason, the value of [macromonomer]/[ethylene] decreases, and the value of MFR10/MFR2 of the ethylene/α-olefin copolymer decreases.

[3] Ethylene Conversion Ratio

If an ethylene conversion ratio is reduced, the ethylene concentration in the solution increases. For this reason, the value of [macromonomer]/[ethylene] decreases, and the value of MFR10/MFR2 of the ethylene/α-olefin copolymer decreases.

[4] Solvent Species

If a high-boiling solvent is used as a polymerization solvent, the ethylene concentration in the solution increases. For this reason, the value of [macromonomer]/[ethylene] decreases, and the value of MFR10/MFR2 of the ethylene/α-olefin copolymer decreases.

Besides controlling the β-hydrogen elimination reaction, control on a chain transfer reaction to Al or the like makes it possible to change the value of [macromonomer]/[ethylene] and change the value of MFR10/MFR2 of the ethylene/α-olefin copolymer.

A solvent used for solution polymerization is usually an inert hydrocarbon solvent and preferably saturated hydrocarbon with a boiling point of 50 to 200 degrees centigrade under normal pressure. Specific examples include aliphatic hydrocarbons such as pentane, hexane, heptane, octane, decane, dodecane, kerosene and the like; and alicyclic hydrocarbons such as cyclopentane, cyclohexane, methylcyclopentane and the like. It should be noted that, Aromatic hydrocarbons such as benzene, toluene, xylene and the like; and halogenated hydrocarbons such as ethylenechloride, chlorobenzene, dichloromethane and the like are also included in the inert hydrocarbon solvent, and there is no limitation on the use thereof.

As described above, in the solution polymerization, not only organic aluminumoxy compounds which are soluble in aromatic hydrocarbons used in the art, but also modified methylaluminoxanes like MMAO, which are soluble in aliphatic hydrocarbons and alicyclic hydrocarbons, can be used. As a result, when aliphatic hydrocarbon or alicyclic hydrocarbon is adopted as a solvent for solution polymerization, it is made possible to almost completely avoid possible mixing of aromatic hydrocarbons into the polymerization system or ethylene/α-olefin copolymer to be produced. In other words, the solution polymerization can reduce environmental loads as well as minimize possible adverse effects on the human body. To suppress variation in physical properties, an ethylene/α-olefin copolymer produced by the polymerization reaction and other desired additives are preferably melted, kneaded and granulated with any optional method.

Ethylene Resin Composition

According to a preferred aspect, the encapsulating material for solar cell of the present invention is composed of 100 weight parts of the aforementioned ethylene/α-olefin copolymer, and an ethylene resin composition containing 0.1 to 5 weight parts of a silane coupling agent such as an ethylenically unsaturated silane compound or the like and 0.1 to 3 weight parts of a crosslinking agent such as organic peroxide or the like.

Furthermore, it is preferable that the ethylene resin composition contains 0.1 to 4 weight parts of an ethylenically unsaturated silane compound and 0.2 to 3 weight parts of organic peroxide, based on 100 weight parts of the ethylene/α-olefin copolymer. It is particularly preferable that the ethylene resin composition contains 0.1 to 3 weight parts of an ethylenically unsaturated silane compound and 0.2 to 2.5 weight parts of organic peroxide, based on 100 weight parts of the ethylene/α-olefin copolymer.

Ethylenically Unsaturated Silane Compound

In the case where the amount of the ethylenically unsaturated silane compound is less than 0.1 weight part, adhesiveness is lowered. On the other hand, in the case where the amount of the ethylenically unsaturated silane compound exceeds 5 weight parts, a balance between the costs and performance of the encapsulating material for solar cell is worsened, and the amount of organic peroxide added for the graft reaction of the ethylene/α-olefin copolymer with an ethylenically unsaturated silane compound at the time of lamination of a solar cell module is increased. For this reason, when the encapsulating material for solar cell is molded in a sheet with a calender molding machine, gelling occurs, and the gels may create irregularities on the sheet surface which deteriorate the appearance in some cases. Moreover, application of a voltage to the sheet containing gels causes cracks around gels inside the sheet, thus reducing the dielectric breakdown resistance. Furthermore, moisture permeation becomes likely to occur at the gel interface, thus decreasing moisture permeability. Also, irregularities formed on the sheet surface reduce its adhesion to glass, a solar cell element, an electrode and a backsheet during the lamination process of a solar cell module, thus resulting in poor adhesion. Further, if an ethylenically unsaturated silane compound is excessive, the ethylenically unsaturated silane compound itself causes a condensation reaction to occur and is present in the encapsulating material for solar cell as white stripes, thus deteriorating the appearance of the product. When the amount of organic peroxide is small after the surplus silane coupling agent is subjected to a condensation reaction with an adherend such as glass or the like, the graft reaction to main chains of the ethylene/α-olefin copolymer becomes insufficient, so that adhesiveness also tends to be lowered.

The ethylenically unsaturated silane compound is not particularly limited and ethylenically unsaturated silane compounds known in the art can be used. Specific examples include vinyltriethoxysilane, vinyltrimethoxysilane, vinyltris (β-methoxyethoxysilane), γ-glycidoxypropyltrimethoxysilane, γ-aminopropyltriethoxysilane, γ-methacryloxypropyltrimethoxysilane and the like. Preferably used are γ-glycidoxypropylmethoxysilane, γ-aminopropyltriethoxysilane, γ-methacryloxypropyltrimethoxysilane and vinyltriethoxysilane, which are excellent in adhesiveness.

Organic Peroxide

When the organic peroxide is less than 0.1 weight parts, the crosslinking properties of the encapsulating material for solar cell such as a crosslinking level or a crosslinking rate are lowered, or the graft reaction of the ethylenically unsaturated silane compound to main chains of the ethylene/α-olefin copolymer becomes insufficient, so that heat resistance and adhesiveness are lowered. Meanwhile, if the organic peroxide exceeds 3 weight parts, when the encapsulating material for solar cell is molded in a sheet with a calender molding machine, gelling occurs, and the gels may create irregularities on the sheet surface which deteriorate the appearance in some cases. Moreover, application of a voltage to the sheet containing gels causes cracks around gels inside the sheet, thus reducing the dielectric breakdown resistance. Furthermore, moisture permeation becomes likely to occur at the gel interface, thus decreasing moisture permeability. Also, irregularities formed on the sheet surface reduce its adhesion to glass, a solar cell element, an electrode and a backsheet during the lamination process of a solar cell module, thus resulting in poor adhesion. Further, during the lamination molding of the solar cell module, crosslinking may excessively proceed such that thermal shrink increase, or the end portion of the solar cell module may not be sufficiently buried in the encapsulating material for solar cell, or thermal shrink may be excessive, resulting in breakage of the solar cell element. Also, if the crosslinking excessively proceeds, change of the ethylene/α-olefin copolymer may proceed, resulting in deteriorations in the heat resistance, the color tone, and the flexibility.

Organic peroxide is used as a radical initiator when an ethylene/α-olefin copolymer is to be graft-modified with an ethylenically unsaturated silane compound, and is further used as a radical initiator when a crosslinking reaction is carried out at the time of lamination molding of a solar cell module of the ethylene/α-olefin copolymer. By graft-modifying the ethylene/α-olefin copolymer with an ethylenically unsaturated silane compound, it is possible to obtain a solar cell module excellent in adhesion to glass, a backsheet, a solar cell element and an electrode. Furthermore, by crosslinking the ethylene/α-olefin copolymer, it is possible to obtain a solar cell module excellent in heat resistance and adhesiveness.

Organic peroxide suitably used may be capable of graft-modifying an ethylene/α-olefin copolymer with an ethylenically unsaturated silane compound, or crosslinking the ethylene/α-olefin copolymer. However, a one-minute half-life temperature of the organic peroxide is from 100 to 170 degrees centigrade in view of a balance between productivity upon calender molding and crosslinking rate at the time of lamination molding of a solar cell module. If the one-minute half-life temperature of the organic peroxide is less than 100 degrees centigrade, when the encapsulating material for solar cell is molded in a sheet with a calender molding machine, gelling occurs, and the gels may create irregularities on the sheet surface which deteriorate the appearance in some cases. Also, application of a voltage causes cracks around gels inside the sheet, thus reducing the dielectric breakdown resistance. Furthermore, moisture permeation becomes likely to occur at the gel interface, thus decreasing moisture permeability. Irregularities formed on the sheet surface reduce its adhesion to glass, a solar cell element, an electrode and a backsheet during the lamination process of a solar cell module, so that adhesion is also lowered. In addition, when the encapsulating material for solar cell is used after long-term storage, the organic peroxide may react to promote the crosslinking of the encapsulating material for solar cell, such that flowability during the lamination molding is reduced or an amount of organic peroxide used as the initiator of the graft reaction of the ethylenically unsaturated silane compound is reduced, or adhesion is lowered. In the case where the one-minute half-life temperature of the organic peroxide exceeds 170 degrees centigrade, the crosslinking rate during lamination molding of a solar cell module is slowed down, so that the productivity of the solar cell module is greatly lowered. Furthermore, heat resistance and adhesiveness of the encapsulating material for solar cell are reduced.

As organic peroxide, known organic peroxides may be used. Preferable concrete examples of the organic peroxide with the one-minute half-life temperature in the range of 100 to 170 degrees centigrade include dilauroyl peroxide, 1,1,3,3-tetramethyl butylperoxy-2-ethylhexanoate, dibenzoyl peroxide, t-amylperoxy-2-ethylhexanoate, t-butylperoxy-2-ethylhexanoate, t-butylperoxy isobutyrate, t-butylperoxy maleate, 1,1-di(t-amylperoxy)-3,3,5-trimethylcyclohexane, 1,1-di(t-amylperoxy)cyclohexane, t-amylperoxy isononanoate, t-amylperoxy-n-octoate, 1,1-di(t-butylperoxy)-3,3,5-trimethylcyclohexane, 1,1-di(t-butylperoxy)cyclohexane, t-butylperoxy isopropyl carbonate, t-butylperoxy-2-ethylhexyl carbonate, 2,5-dimethyl-2,5-di(benzoylperoxy) hexane, t-amyl-peroxy benzoate, t-butylperoxy acetate, t-butylperoxy isononanoate, 2,2-di(t-butylperoxy)butane, t-butylperoxy benzoate and the like. Preferably used are dilauroyl peroxide, t-butylperoxy isopropyl carbonate, t-butylperoxy acetate, t-butylperoxy isononanoate, t-butylperoxy-2-ethylhexyl carbonate, t-butylperoxy benzoate and the like.

Ultraviolet Absorber, Light Stabilizer, Heat-resistant Stabilizer

It is preferable that the ethylene resin composition may contain at least one additive selected from the group consisting of an ultraviolet absorber, a light stabilizer and a heat-resistant stabilizer. The compounding amount of the additive is preferably from 0.005 to 5 weight parts, based on 100 weight parts of the ethylene/α-olefin copolymer. It is preferable to add at least two kinds of the additives selected from the above three kinds, and it is particularly preferable to add all of the three kinds. In the case where the compounding amount of the aforementioned additive is within the above range, it is possible to fully ensure improvement of resistance to high temperature and high humidity, resistance of the heat cycle, weather resistant stability and heat resistant stability, as well as to prevent reduction in the transparency of the encapsulating material for solar cell and its adhesion to glass, a backsheet, a solar cell element, an electrode and aluminum.

Specific examples of the ultraviolet absorber include benzophenones such as 2-hydroxy-4-n-octyloxybenzophenone, 2-hydroxy-4-methoxybenzophenone, 2,2-dihydroxy-4-methoxybenzophenone, 2-hydroxy-4-methoxy-4-carboxybenzophenone, 2-hydroxy-4-N-octoxybenzophenone and the like; benzotriazoles such as 2-(2-hydroxy-3,5-di-t-butylphenyl)benzotriazole, 2-(2-hydroxy-5-methylphenyl)benzotriazole and the like; and Salicylic acid esters such as phenylsalicylate, p-octylphenylsalicylate and the like.

As the light stabilizer, preferably used are hindered amines and hindered piperidine compounds such as bis(2,2,6,6-tetramethyl-4-piperidyl)sebacate, poly[{6-(1,1,3,3-tetramethylbutyl)amino-1,3,5-triazine-2,4-diyl}{(2,2,6,6-tetramethyl-4-piperidyl)imino}hexamethylene{(2,2,6,6-tetramethyl-4-piperidyl)imino}] and the like.

Specific examples of the heat-resistant stabilizer include phosphite heat-resistant stabilizers such as tris(2,4-di-tert-butylphenyl)phosphite, bis[2,4-bis(1,1-dimethylethyl)-6-methylphenyl]ethyl phosphorous acid ester, tetrakis(2,4-di-tert-butylphenyl)[1,1-biphenyl]-4,4'-diylbisphosphonate, bis(2,4-di-tert-butylphenyl)pentaerythritoldiphosphite and the like; lactone heat-resistant stabilizers such as a reaction product of 3-hydroxy-5,7-di-tert-butyl-furan-2-one and o-xylene and the like; hindered phenol heat-resistant stabilizers such as 3,3',3'',5,5',5''-hexa-tert-butyl-a,a',a''-(methylene-2,4,6-triyl)tri-p-cresol, 1,3,5-trimethyl-2,4,6-tris(3,5-di-tert-butyl-4-hydroxyphenyl)benzylbenzene, pentaerythritoltetrakis[3-(3,5-di-tert-butyl-4-hydroxyphenyl)propionate], octadecyl-3-(3,5-di-tert-butyl-4-hydroxyphenyl)propionate, thiodiethylenebis[3-(3,5-di-tert-butyl-4-hydroxyphenyl)propionate] and the like; sulfur heat-resistant stabilizers; amine heat-resistant stabilizers and the like. These heat-resistant stabilizers may be used singly or two or more kinds may be used in combination. Among these, preferably used are phosphite heat-resistant stabilizers and hindered phenol heat-resistant stabilizers.

Other Additives

In addition to the above components, the ethylene resin composition constituting the encapsulating material for solar cell may suitably contain various components in the ranges in which the object of the present invention is not impaired. Examples include various polyolefins other than the ethylene/α-olefin copolymer, styrene based or ethylene based block copolymers, propylene based polymers and the like. These components may be contained in an amount of 0.0001 to 50 weight parts and preferably 0.001 to 40 weight parts, based on 100 weight parts of the aforementioned ethylene/α-olefin copolymer. Furthermore, at least one kind of the additives selected from various resins other than polyolefins, and/or various rubbers, plasticizers, fillers, pigments, dyes, antistatic agents, anti-bacterial agents, anti-mold agents, flame retardants, crosslinking aids and dispersing agents may be suitably contained.

In particular, when a crosslinking aid is contained, the compounding amount of the crosslinking aid is from 0.05 to 5 weight parts, based on 100 weight parts of the ethylene/α-olefin copolymer. In the case where the compounding amount of the crosslinking aid is within the range, the resultant ethylene resin composition may have a suitable crosslinked structure and thus have improved heat resistance, mechanical properties and adhesion.

As the crosslinking aid, there may be used crosslinking aids known in the art which are generally used for producing olefin based resins. Such a crosslinking aid is a compound having double bonds in a molecule. Specific examples include monoacrylates such as t-butyl acrylate, lauryl acrylate, cetyl acrylate, stearyl acrylate, 2-methoxyethyl acrylate, ethylcarbitol acrylate, methoxytripropylene glycol acrylate and the like; monomethacrylates such as t-butyl methacrylate, lauryl methacrylate, cetyl methacrylate, stearyl methacrylate, methoxyethylene glycol methacrylate, methoxypolyethylene glycol methacrylate and the like; diacrylates such as 1,4-butanediol diacrylate, 1,6-hexanediol diacrylate, 1,9-nonanediol diacrylate, neopentyl glycol diacrylate, diethylene glycol diacrylate, tetraethylene glycol diacrylate, polyethylene glycol diacrylate, tripropylene glycol diacrylate, polypropylene glycol diacrylate and the like; dimethacrylates such as 1,3-butanediol dimethacrylate, 1,6-hexanediol dimethacrylate, 1,9-nonanediol dimethacrylate, neopentyl glycol dimethacrylate, ethylene glycol dimethacrylate, diethylene glycol dimethacrylate, triethylene glycol dimethacrylate, polyethylene glycol dimethacrylate and the like; triacrylates such as trimethylolpropane triacrylate, tetramethylolmethane triacrylate, pentaerythritol triacrylate and the like; trimethacrylates such as trimethylolpropane trimethacrylate, trimethylolethane trimethacrylate and the like; tetraacrylates such as pentaerythritol tetraacrylate, tetramethylolmethane tetraacrylate and the like; divinyl aromatic compounds such as divinylbenzene, di-i-propenylbenzene and the like; cyanurates such as triallyl cyanurate, triallyl isocyanurate and the like; diallyl compounds such as diallyl phthalate and the like; triallyl compounds; oximes such as p-quinonedioxime, p-p'-dibenzoyl quinonedioxime and the like; and maleimides such as phenylmaleimide and the like. Among these crosslinking aids, more preferably used are diacrylates; dimethacrylates; divinyl aromatic compounds; triacrylates such as trimethylolpropane triacrylate, tetramethylolmethane triacrylate, pentaerythritol triacrylate and the like; trimethacrylates such as trimethylolpropane trimethacrylate, trimethylolethane trimethacrylate and the like; tetraacrylates such as pentaerythritol tetraacrylate, tetramethylolmethane tetraacrylate and the like; cyanurates such as triallyl cyanurate, triallyl isocyanurate and the like; diallyl compounds such as diallyl phthalate and the like; triallyl compounds; oximes such as p-quinonedioxime, p-p'-dibenzoyl quinonedioxime and the like; and maleimides such as phenylmaleimide and the like. Among these, particularly preferably used is triallyl isocyanurate because it is the most excellent in a balance between generation of bubbles of the encapsulating material for solar cell after lamination and crosslinking properties.

According to another preferred aspect, for the ethylene resin composition used for the encapsulating material for solar cell, the time required for reaching 90% of the maximum torque value (Tc90) measured at 150 degrees centigrade and an inversion rate of 100 cpm using a curelastometer is from 8 to 14 minutes. The time is more preferably from 8 to 13 minutes, and further preferably from 9 to 12 minutes. In a case where the Tc90 is less than 8 minutes, when the encapsulating material for solar cell is molded in a sheet with a calender molding machine, gelling occurs, and the gels may create irregularities on the sheet surface which deteriorate the appearance in some cases. Also, application of a voltage causes cracks around gels inside the sheet, thus reducing the dielectric breakdown resistance. Furthermore, moisture permeation becomes likely to occur at the gel interface, thus decreasing moisture permeability.

Irregularities formed on the sheet surface reduce its adhesion to glass, a solar cell element, an electrode and a backsheet during the lamination process of a solar cell module, so that adhesion is also lowered. In the case where Tc90 exceeds 14 minutes, the time required for crosslinking during the lamination process of a solar cell module becomes longer, so that the time involved in producing a solar cell module tends to be prolonged.

According to another preferred aspect, the ethylene resin composition used for the encapsulating material for solar cell is kneaded under the conditions of 120 degrees centigrade and 30 rpm with a microrheology compounder, and thus the time to rise from the minimum torque to 0.1 Nm is from 10 to 100 minutes. The time to rise from the minimum torque to 0.1 Nm is more preferably from 10 to 90 minutes, and further preferably from 10 to 80 minutes. If the time to rise from the minimum torque to 0.1 Nm is less than 10 minutes, when the encapsulating material for solar cell is molded in a sheet with a calender molding machine, gelling occurs, and the gels may create irregularities on the sheet surface which deteriorate the appearance in some cases. Moreover, application of a voltage to the sheet containing gels causes cracks around gels inside the sheet, thus reducing the dielectric breakdown resistance. Furthermore, moisture permeation becomes likely to occur at the gel interface, thus reducing moisture permeability. Irregularities formed on the sheet surface reduce its adhesion to glass, a thin film electrode and a backsheet during the lamination process of a solar cell module, so that adhesion is also lowered. In the case where the time to rise from the minimum torque to 0.1 Nm exceeds 100 minutes, crosslinking properties during the lamination molding of a solar cell module become insufficient, thus resulting in lowered heat resistance and less adhesion to glass.

Encapsulating Material for Solar Cell

The encapsulating material for solar cell of the present invention is excellent in a balance among adhesion to various solar cell members such as glass, a backsheet, a thin film electrode, aluminum frame, a solar cell element and the like, heat resistance, calender moldability and crosslinking properties, and is further excellent in a balance among transparency, flexibility, appearance, weather resistance, volume resistivity, electrical insulation properties, moisture permeability, corrosiveness of electrodes and process stability. Thus, the encapsulating material for solar cell is suitably used as an encapsulating material for solar cell of a solar cell module known in the art. As a method for producing the encapsulating material for solar cell of the present invention, those methods usually used can be used. The encapsulating material for solar cell is preferably produced by melt blending using a kneader, a banbury mixer, an extruder, a calender molder or the like. In particular, it is preferable to use a calender molder.

According to another preferred exemplary embodiment, the entire shape of the encapsulating material for solar cell is in a sheet form. Furthermore, an encapsulating material for solar cell having at least one layer of a sheet consisting of the aforementioned ethylene resin composition and combined with additional layers can also be suitably used. The thickness of a layer of the encapsulating material for solar cell is usually from 0.01 to 2 mm, preferably from 0.05 to 1.5 mm, further preferably from 0.1 to 1.2 mm, particularly preferably from 0.2 to 1 mm, more preferably from 0.3 to 0.9 mm, and most preferably from 0.3 to 0.8 mm. In the case where the thickness is within this range, breakage of glass, a solar cell element, a thin film electrode or the like can be suppressed during the lamination process, and high photovoltaic power can be achieved by securing sufficient light transmittance. Such a thickness is preferable because lamination molding of a solar cell module can be performed at a low temperature.

There are no particular limitations on the method of molding a sheet made of an encapsulating material for solar cell, and various molding methods known in the art (cast molding, extrusion sheet molding, inflation molding, injection molding, compression molding, calender molding and the like) can be employed. In particular, it is the most preferable to perform calender molding while performing melt-kneading of an ethylene/α-olefin copolymer, a silane coupling agent, an ultraviolet absorber, alight stabilizer, a heat-resistant stabilizer, and other necessary additives usable, with a calender molding machine for rolling a melt resin through heated metal rolls (calender rolls) to produce a sheet or film having a desired thickness, thereby obtaining a sheet-like encapsulating material for solar cell. As the calender molding machine, various known calender molding machines can be used, and mixing roll machines, three-roll calender machines, and four-roll calender machines can be used. As a four-roll calender machine, particularly an I-type, S-type, inverse L-type, Z-type, oblique Z-type, or the like can be used. Also, before application to a roll calender machine, it is preferable to heat the ethylene resin composition to an appropriate temperature. To this end, for example, it is preferable to provide a banbury mixer, a kneader, an extruder, and the like. In the temperature ranges for the calender molding, a roll temperature is generally set at 40 to 100 degrees centigrade. If the roll temperature is lower than 40 degrees centigrade, the intrusion property of the ethylene resin composition into the bank is lowered, and thus productivity is lowered. Meanwhile, if the roll temperature exceeds 100 degrees centigrade, when the encapsulating material for solar cell is molded in a sheet with a calender molding machine, gelling occurs, and the gels may create irregularities on the sheet surface which deteriorate the appearance in some cases. Moreover, application of a voltage to the sheet containing gels causes cracks around gels inside the sheet, thus reducing the dielectric breakdown resistance. Furthermore, moisture permeation becomes likely to occur at the gel interface, thus reducing moisture permeability. Irregularities formed on the sheet surface reduce its adhesion to glass, a solar cell element, an electrode and a backsheet during the lamination process of a solar cell module, so that adhesion is also lowered.

Meanwhile, a sheet (or layer) made of the encapsulating material for solar cell may be embossed on its surface. By embossing the sheet surface of the encapsulating material for solar cell, possible blocking between the encapsulating sheets or between the encapsulating sheet and other sheet can be avoided. Furthermore, since embossed features reduce the storage elastic modulus of the encapsulating material for solar cell, they act as a cushion for solar cell elements during the lamination of the encapsulating material for solar cell and the solar cell elements, and thus breakage of the solar cell elements can be avoided.

The porosity (P)(%) of the encapsulating material sheet for solar cell is preferably from 10 to 50%, more preferably from 10 to 40%, and further preferably from 15 to 40%, and the porosity (P) is defined as the percentage ratio ($V_H/V_A \times 100$) of the total volume ($V_H$) of concave portions per unit area of the encapsulating material sheet for solar cell to its apparent volume ($V_A$) of the encapsulating material sheet for solar cell. It should be noted that, the apparent volume ($V_A$) of the encapsulating material for solar cell is determined by multiplying the maximum thickness of the encapsulating material sheet for solar cell by the unit area. When the porosity (P) is less than 10%, the elastic modulus of the encapsulating material for solar cell is not sufficiently lowered and sufficient cushion is not achieved. Thus, when modules are laminated together in the second stage (pressurizing step) during the manufacture of a module, breakage of crystalline solar cell element or solder that fixes the crystalline solar cell element to the electrode occurs in the case of crystalline solar cells, or breakage of silver electrode occurs in the case of thin film solar cells. Specifically, in the case where the porosity (P) of the encapsulating material for solar cell containing a sheet made of the ethylene resin composition is less than 10%, when the encapsulating material for solar cell is locally loaded with pressure, pressurized convex portions are not deformed like being collapsed. This causes breakage of, for example, crystalline solar cells during the lamination process as a result of local application of large pressure on the crystalline solar cells. Moreover, in the case where the porosity (P) of the encapsulating material for solar cell is less than 10%, there is less space for air to travel through, resulting in failure to pump out the air during the lamination process. The air trapped in the solar cell module may deteriorate the appearance, or the moisture remained in the air may corrode electrodes during long-term usage in some cases. Moreover, during the lamination process, the melted ethylene resin composition fails to fill the space, and therefore the excessive ethylene resin composition may squeeze out of respective adherends of the solar cell modules to contaminate the laminator in some cases.

On the other hand, in the case where the porosity (P) is greater than 80%, it becomes likely that air cannot be completely removed during the pressurizing step of the lamination process, so that the air remains trapped in the solar cell module. The air trapped in the solar cell module may deteriorate the appearance of the solar cell module, or the moisture remained in the air may corrode electrodes during long-term usage. Failure to completely remove the air during the pressurizing step of the lamination process also reduces the contact area between the encapsulating material for solar cell and the adherend, thus leading to poor adhesion strength.

The porosity (P) can be determined through the following calculation. The apparent volume $V_A$ (mm$^3$) of the embossed encapsulating material for solar cell is calculated by multiplying the maximum thickness $t_{max}$ (mm) of the encapsulating material for solar cell by the unit area (for example, 1 m$^2$=1000×1000=10$^6$ mm$^2$) according to the following equation (2):

$$V_A(\text{mm}^3) = t_{max}(\text{mm}) \times 10^6 (\text{mm}^2) \quad (2)$$

On the other hand, the actual volume $V_O$ (mm$^3$) of the encapsulating material for solar cell for the unit area is calculated by substituting specific gravity ρ (g/mm$^3$) of the resin constituting the encapsulating material for solar cell and the actual weight W(g) of the encapsulating material for solar cell per unit area (1 m$^2$) into the following equation (3):

$$V_O(\text{mm}^3) = W/\rho \quad (3)$$

The total volume $V_H$ (mm$^3$) of the concave portions per unit area of the encapsulating material for solar cell is calculated by subtracting the actual volume $V_O$ from the apparent volume $V_A$ of the encapsulating material for solar cell as shown in the following equation (4):

$$V_H(\text{mm}^3) = V_A - V_O = V_A - (W/\rho) \quad (4)$$

The porosity (%) can thus be determined according to the following equation:

$$\text{Porosity } (P) \ (\%) = V_H / V_A \times 100$$
$$= (V_A - (W/\rho))/V_A \times 100$$
$$= 1 - W/(\rho \cdot V_A) \times 100$$
$$= 1 - W/(\rho \cdot t_{max} \cdot 10^6) \times 100$$

The porosity (%) can be determined according to the above equation, and can also be determined by microscopic observation, image processing or the like of an actual cross section or embossed surface of the encapsulating material for solar cell.

The depth of the concave portions formed by embossing is preferably from 20 to 95%, more preferably from 50 to 95%, and further preferably from 65 to 95% of the maximum thickness of the encapsulating material for solar cell. The percentage ratio of the depth (D) of the concave portions to the maximum sheet thickness $t_{max}$ may be referred to as the depth ratio of the concave portions in some cases.

The depth of the embossed concave portions refers to the vertical interval D between the top of the convex portions and the bottom of the concave portions on the embossed irregular surface of the encapsulating material for solar cell. The maximum thickness $t_{max}$ of the encapsulating material for solar cell refers to the distance from the top of the convex portions on the embossed surface of the encapsulating material for solar cell to the other surface (in the thickness direction of the encapsulating material for solar cell) in the case where the encapsulating material for solar cell is embossed on one surface, and the distance from the top of the convex portions on one surface to the top of the convex portions on the other surface (in the thickness direction of the encapsulating material for solar cell) in the case where the encapsulating material for solar cell is embossed on both surfaces.

Embossing may be performed on one surface or both surfaces of the encapsulating material for solar cell. When the depth of the embossed concave portions is increased, embossing is preferably performed on only one surface of the encapsulating material for solar cell. In the case where the encapsulating material for solar cell is embossed on only one surface, the maximum thickness $t_{max}$ of the encapsulating material for solar cell is from 0.01 to 2 mm, preferably from 0.05 to 1 mm, further preferably from 0.1 to 1 mm, further preferably from 0.15 to 1 mm, further preferably from 0.2 to 1 mm, further preferably from 0.2 to 0.9 mm, further preferably from 0.3 to 0.9 mm, and the most preferably from 0.3 to 0.8 mm. In the case where the maximum thickness $t_{max}$ of the encapsulating material for solar cell is within this range, not only possible breakage of glass, a solar cell element, a thin film electrode and the like can be avoided in the lamination process, but the lamination molding of a solar cell module is made possible at a relatively low temperature; therefore, it is preferable. Moreover, the encapsulating material for solar cell can have sufficient light transmittance, and a solar cell module using the encapsulating material for solar cell generates high photovoltaic power.

Meanwhile, the sheet can be used as an encapsulating material for solar cell in a sheet form which is cut to a size to fit the solar cell module or in a roll form which can be cut to a size to fit the solar cell module right before the manufacture of it. According to a preferred exemplary embodiment of the present invention, the encapsulating material for solar cell in a sheet form may have at least one layer made of the encapsulating material for solar cell. Accordingly, the number of layers made of the encapsulating material for solar cell of the present invention may be either one, or two or more. The number of layers is preferably one from the viewpoints of simplifying the structure for lower costs and reducing the reflection of light at the interface between layers for efficient utilization of light as much as possible.

The encapsulating material for solar cell may be composed of only layers made of the encapsulating material for solar cell of the present invention, or may additionally have layers other than layers containing the encapsulating material for solar cell (hereinafter also referred to as the additional layers). Examples of additional layers include, when classified according to the intended purpose, a hard coating layer for protecting a surface or a back surface, an adhesive layer, an anti-reflection layer, a gas barrier layer, an anti-fouling layer and the like. Examples of additional layers include, when classified according to the material, a layer made of an ultraviolet curable resin, a layer made of a thermosetting resin, a layer made of a polyolefin resin, a layer made of a carboxylic acid-modified polyolefin resin, a layer made of a fluorine-containing resin, a layer made of a cyclic olefin (co)polymer, a layer made of an inorganic compound and the like.

There are no particular limitations on the positional relationship between the layer made of the encapsulating material for solar cell of the present invention and the additional layers. A preferable layer construction is properly selected in relation to the purpose of the present invention. That is, the additional layers may be provided between two or more layers made of the encapsulating material for solar cell, may be located at the outermost layer of the encapsulating material for solar cell, or may be provided at other positions. Furthermore, the additional layers may be provided on only one surface or both surfaces of the layer made of the encapsulating material for solar cell. The number of the additional layers is not particularly limited, and any number of the additional layers may be provided or may not be provided.

From the viewpoints of simplifying the structure for lower costs and reducing the reflection of light at the interface for efficient utilization of light as much as possible, the encapsulating material for solar cell may be manufactured only with a layer made of the encapsulating material for solar cell of the present invention without providing additional layers. However, when the additional layers are needed in relation to the purpose or are useful, such additional layers may be properly provided. In a case of proving another layer, a method of laminating a layer made of the encapsulating material for solar cell of the present invention and another layer is not particularly limited. As preferable examples of the laminating method, there are (i) a method of performing coextrusion using known melt extruders such as a cast molding machine, an extrusion sheet molding machine, an inflation molding machine, and an injection molding machine so as to obtain a laminate, (ii) a method of melt-laminating or heat-laminating a layer on another preformed layer so as to obtain a laminate, (iii) a method of arranging multiple calender molding machines and piling up and rolling sheets discharged from the individual calender molding machines, and the like. Moreover, the lamination may be effected through a dry lamination method or a heat lamination method in which a suitable adhesive is used. Examples of the adhesive include maleic anhydride-modified polyolefin resins such as "ADMER" manufactured by Mitsui Chemicals, Inc. and "MODIC" manufactured by Mitsubishi Chemical Corporation; low (non) crystalline elastic polymers such as unsaturated polyolefin and the like; acrylic adhesives represented by a terpolymer of ethylene, acrylate and maleic anhydride such as "BONDINE" manufactured by Sumica CDF; ethylene/vinyl acetate copolymers; and adhesive resin compositions containing the foregoing. Adhesives with heat resistance of about 120 to 150 degrees centigrade are preferably used. Preferable examples thereof include polyester based and polyurethane based adhesives. In order to improve adhesion between the two layers, they may be subjected, for example, to silane coupling treatment, titanium coupling treatment, corona treatment, plasma treatment or the like.

2. Solar Cell Module

Examples of the solar cell module include crystalline solar cell modules in which solar cell elements formed using polycrystalline silicon or the like are sandwiched between the encapsulating material for solar cell, and the module is covered with protective sheets on both surfaces. That is, a typical solar cell module consists of a protective sheet for a solar cell module (surface protective member), an encapsulating material for solar cell, a solar cell element, an encapsulating material sheet for solar cell and a protective sheet for a solar cell module (back surface protective member). However, according to a preferred exemplary embodiment of the present invention, the structure of the solar cell module is not limited to the above structure. Some of the above respective layers may be properly disposed of, or the above additional layers may be properly provided in the ranges in which the object of the present invention is not impaired. Examples of the additional layers include an adhesive layer, a shock absorbing layer, a coating layer, an anti-reflection layer, a back surface re-reflection layer, a light diffusion layer and the like. These layers are not particularly limited, and can be provided in place in any desired location in consideration of the intended purpose of respective layers and their characteristics. If the solar cell element for the module is a crystalline power generation element, since there is a probability that the PID will be observed, the present invention can be particularly appropriately applied.

Crystalline Silicon Solar Cell Module

FIG. 1 is a cross sectional view schematically illustrating one exemplary embodiment of a solar cell module of the present invention. It should be noted that, in FIG. 1, an example of a configuration of a crystalline silicon solar cell module 20 is illustrated. As illustrated in FIG. 1, the solar cell module 20 has a plurality of crystalline silicon solar cell elements 22 electrically interconnected via interconnectors 29, and a pair of a surface protective member 24 and a back surface protective member 26 which sandwich solar cell elements 22. An encapsulating layer 28 is filled among these protective members and a plurality of solar cell elements 22. The encapsulating layer 28 is obtained by bonding together the encapsulating material for solar cell of the present invention and pressing the bonded sheets under heating. The encapsulating layer 28 is in contact with electrodes respectively formed on the light-incident surface and the back surface of each solar cell element 22. These electrodes are current collectors respectively formed on the light-incident surface and the back surface of respective solar cell elements 22, and each includes collector lines, tab-type busbars, back surface electrode layers and the like.

Figure 2:
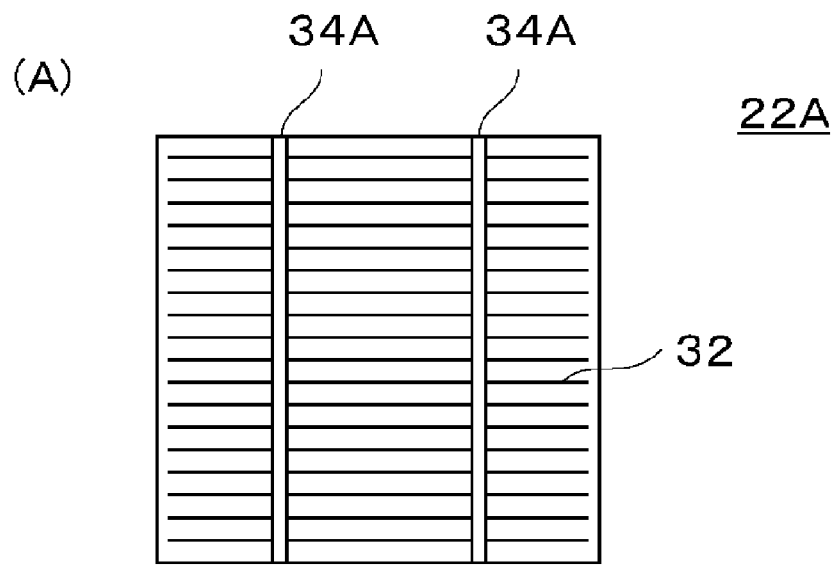
FIG. 2 is a plan view schematically illustrating a configuration of a light-incident surface and a back surface of the solar cell element.
Figure 2:
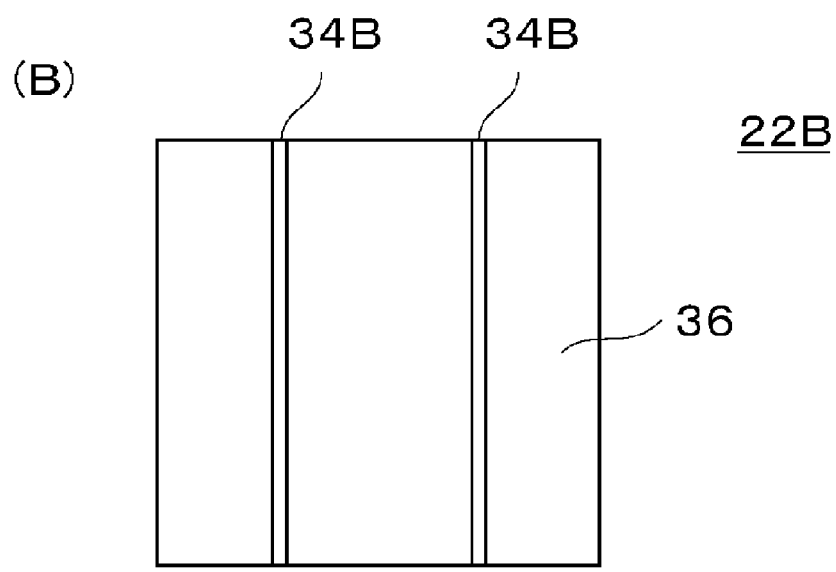

FIG. 2 is a plan view schematically illustrating a configuration of a light-incident surface and a back surface of the solar cell element. In FIG. 2, an example of a configuration of a light-incident surface 22A and a back surface 22B of the solar cell elements 22 is illustrated. As illustrated in FIG. 2(A), the solar cell element 22 includes multiple collector lines 32 in a line form, and tab-type busbars 34A that are connected to interconnectors 29 and collect electrical charges from the collector lines 32 formed on the light-incident surface 22A. Moreover, as shown in FIG. 2(B), the solar cell element 22 includes a conductive layer (back surface electrode) 36 formed on the entire surface of the back surface 22B, and tab-type busbars 34B formed thereon that are connected to interconnectors 29 (FIG. 1) and collect electrical charges from the conductive layer 36. The line width of the collector lines 32 is, for example, about 0.1 mm; the line width of the tab-type busbars 34A is, for example, about 2 to 3 mm; and the line width of the tab-type busbars 34B is, for example, about 5 to 7 mm. The thickness of the collector lines 32, tab-type busbars 34A and tab-type busbars 34B is, for example, about 20 to 50 µm.

It is preferable that the collector lines 32, tab-type busbars 34A and tab-type busbars 34B contain a metal with high conductivity. Examples of the metal with high conductivity include gold, silver, copper and the like, and preferably used are silver, silver compounds, silver-containing alloys and the like from the viewpoints of high conductivity and high corrosion resistance. It is preferable that the conductive layer 36 contains not only a metal with high conductivity, but also a component with high light reflectivity, such as aluminum, for reflecting light incident on the light-incident surface to enhance the opto-electronic conversion efficiency of the solar cell element. The collector lines 32, tab-type busbars 34A, tab-type busbars 34B and conductive layer 36 are formed by applying a conductive material paint containing the aforementioned metal with high conductivity onto either the light-incident surface 22A or the back surface 22B of the solar cell elements 22, by, for example, screen printing to a thickness of 50 µm, drying the applied material and, as necessary, baking the applied material at 600 to 700 degrees centigrade.

The surface protective member 24 needs to be transparent as it is placed on the light-incident surface side. Examples of the surface protective member 24 include transparent glass plates, transparent resin films and the like. On the other hand, the back surface protective member 26 needs not to be transparent; therefore, the material thereof is not particularly limited. Examples of the back surface protective member 26 include glass substrates, plastic films and the like, and glass substrates are suitably used from the viewpoints of durability and transparency.

The solar cell module 20 can be obtained by any production method. The solar cell module 20 can be obtained by, for example, a production method including the steps of: obtaining a laminate in which the back surface protective member 26, an encapsulating material for solar cell, a plurality of solar cell elements 22, an encapsulating material sheet for solar cell and the surface protective member 24 are laminated in this order; pressing the laminate with a laminator or the like and optionally heating the laminate as necessary; and further curing the aforementioned encapsulating material by heating the laminate as necessary after the above steps.

Power collecting electrodes for taking out generated electricity are usually provided on the solar cell elements. Examples of the power collecting electrode include busbar electrodes, finger electrodes and the like. In general, the power collecting electrodes are provided on both the surface and the back surface of the solar cell element. However, when the power collecting electrodes are provided on the light-incident surface, there is a problem of lowering the power generation efficiency due to the power collecting electrodes shielding the light.

In recent years, in order to improve power generation efficiency, a back contact type solar cell element without requiring placement of power collecting electrodes on the light-incident surface has been proposed. According to one aspect of the back contact type solar cell element, p-doped regions and n-doped regions may be alternately formed on the opposite side (rear surface side) of the solar cell element to the light-incident surface. According to another aspect of the back contact type solar cell element, a p/n junction may be formed on a substrate with through-holes formed therein, a doped layer may be formed on the surface (light-incident surface) side up to the inner walls of the through-holes and the peripheries of the through-holes of the back surface side, and the current on the light-incident surface may be taken out at the back surface side.

Thin Film Silicon (Amorphous Silicon) Solar Cell Module

The thin film silicon solar cell module may be configured as (1) a laminate in which module components are laminated in the order of a transparent surface protective member (glass substrate), a thin film solar cell element, an encapsulating layer and a back surface protective member; (2) a laminate in which module components are laminated in the order of a transparent surface protective member, an encapsulating layer, a thin film solar cell element, an encapsulating layer and a back surface protective member; or the like. The transparent surface protective member, the back surface protective member and the encapsulating layer are identical to those for the crystalline silicon solar cell module described above.

According to the aspect (1), the thin film solar cell element contains, for example, a transparent electrode layer, a pin type silicon layer and a back surface electrode layer in this order. Examples of the transparent electrode layer include semiconductor oxides such as $In_2O_3$, $SnO_2$, ZnO, $Cd_2SnO_4$, ITO ($In_2O_3$ doped with Sn) and the like. Examples of the back surface electrode layer include thin film silver layers. Respective layers are formed by plasma CVD (chemical vapor deposition) or sputtering. The encapsulating layer is placed so as to contact with the back surface electrode layer (for example, thin film silver layer). The transparent electrode layer is formed on the transparent surface protective member, so that the encapsulating layer is not placed between the surface protective member and the transparent electrode layer in many cases.

According to the aspect (2), the thin film solar cell element contains, for example, a transparent electrode layer, a pin type silicon layer and a metal foil or a thin film metal layer (for example, thin film silver layer) formed on the heat-resistant polymer film in this order. Examples of the metal foil include stainless steel foils and the like. Examples of the heat-resistant polymer film include polyimide films and the like. The transparent electrode layer and the p-i-n type silicon layer are formed by plasma CVD or sputtering in the same manner as described above. That is, the p-i-n type silicon layer is formed on the metal foil or the thin film metal layer formed on the heat-resistant polymer film; and the transparent electrode layer is formed on the pin type silicon layer. Moreover, the thin film metal layer to be formed on the heat-resistant polymer film is also formed by plasma CVD or sputtering.

In this case, the encapsulating layer is provided between the transparent electrode layer and the surface protective member, and between the metal foil or heat-resistant polymer film and the back surface protective member respectively. In this way, the encapsulating layer obtained from an encapsulating material for solar cell is in contact with the electrodes of solar cell elements, such as collector lines, tab-type busbars and conductive layer. According to the aspect (2), the thin film solar cell element has silicon layers that are thinner than those for the crystalline silicon solar cell elements and thus less prone to breakage by the pressure applied during the production of a solar cell module or by external impact during operation of the aforementioned module. For this reason, the encapsulating material for solar cell used for thin film solar cell modules may be less flexible than those used for crystalline silicon solar cell modules. On the other hand, since the electrodes of the thin film solar cell elements are formed of thin film metal layers as described above, there is the risk of significantly decreasing the power generation efficiency when they are degraded by corrosion. Accordingly, the encapsulating material for solar cell of the present invention containing a sheet made of the ethylene resin composition, which is less flexible than an ethylene/vinyl acetate (EVA) copolymer but does not necessarily require a crosslinking agent which causes cracked gas, is more suitably used as an encapsulating material for use in thin film solar cell modules.

Meanwhile, other solar cell module includes a solar cell module using silicon for a solar cell element. Examples of the solar cell module using silicon for a solar cell element include a hybrid type (HIT) solar cell module in which crystalline silicon and amorphous silicon are laminated; a multi-junction type (tandem) solar cell module in which silicon layers with different absorption wavelength ranges are laminated; a back contact type solar cell module in which p-doped regions and n-doped regions are alternately formed on the back surface arranged on a side opposite to the light-incident surface of the solar cell element; and a spherical silicon solar cell module in which a large number of spherical silicon particles (about 1 mm in diameter) and a concave mirror (also serves as an electrode) having a diameter of 2 to 3 mm to increase the light-gathering ability are combined. Other examples of the solar cell module using silicon for a solar cell element include a field-effect solar cell module in which the role of a conventional amorphous silicon p-type window layer with p-i-n junction is changed from "insulated transparent electrode" to "inversion layer induced by electric field effect" and the like. Other examples thereof include a GaAs solar cell module in which monocrystalline GaAs is used for a solar cell element; a CIS or CIGS (chalcopyrite) solar cell module in which I-III-VI compounds called chalcopyrite compounds formed of Cu, In, Ga, Al, Se, S and the like are used instead of silicon as a solar cell element; a CdTe—CdS solar cell module in which thin films of Cd compounds are used as a solar cell element; a $Cu_2ZnSnS_4$ (CZTS) solar cell module; and the like. The encapsulating material for solar cell of the present invention can be used as an encapsulating material for solar cell of all types of the above solar cell modules.

In particular, a filler layer laminated under a photovoltaic device constituting a solar cell module needs to have adhesion to a filler layer, an electrode and a back surface protective layer which are laminated over the photovoltaic device. In order to keep smoothness of the back surface of the solar cell element as a photovoltaic device, the filler layer laminated under a photovoltaic device needs to have thermal plasticity. Furthermore, in order to protect the solar cell element as a photovoltaic device, the filler layer laminated under a photovoltaic device needs to have excellent scratch resistance and shock absorbance.

The above filler layer preferably has heat resistance. In particular, it is preferable that the ethylene resin composition constituting the filler layer does not undergo degeneration, degradation or decomposition due to heating action during the lamination process including vacuum absorbing and heat pressing for the manufacture of a solar cell module, or due to thermal action by sunlight during the long-term operation of the solar cell module. If the additives or the like contained in the ethylene resin composition are eluted, or any decomposed product is generated, they act on the photovoltaic surface (device surface) of the solar cell element to deteriorate their function and performance. Thus, heat resistance is an indispensable property for the filler layer of the solar cell module. The above filler layer preferably has excellent moisture resistance. In this case, excellent moisture resistance prevents moisture permeation from the back surface of the solar cell module, thus avoiding possible corrosion and degradation of the photovoltaic device of the solar cell module.

The above filler layer is different from the filler layer laminated over the photovoltaic device, and needs not necessarily to be transparent. The encapsulating material for solar cell of the present invention has characteristics described above. Thus, the encapsulating material for solar cell of the present invention can be suitably used as an encapsulating material for solar cell on the back surface of the crystalline solar cell module and as an encapsulating material for solar cell of the thin film solar cell module which is susceptible to moisture permeation.

Surface Protective Member for Solar Cell Module

The surface protective member for a solar cell module used for a solar cell module is not particularly limited. However, since the member is located at the outermost layer of the solar cell module, it preferably has such properties that allow long-term reliability for outdoor exposure of the solar cell module, including weather resistance, water repellency, contamination resistance and mechanical strength. The surface protective member is preferably a sheet with less optical loss and high transparency for efficient utilization of sunlight.

Examples of the material of the surface protective member for a solar cell module include resin films made of a polyester resin, a fluorine resin, an acrylic resin, a cyclic olefin (co) polymer or an ethylene-vinyl acetate copolymer, glass substrates and the like. Preferable resin films include films made of a polyester resin excellent in transparency, strength, costs and the like, particularly films made of a polyethylene terephthalate resin, and films made of a fluorine resin having good weather resistance. Examples of the fluorine resin include tetrafluoroethylene/ethylenic copolymers (ETFE), polyvinyl fluoride resins (PVF), polyvinylidene fluoride resins (PVDF), polytetrafluoroethylene resins (TFE), tetrafluoroethylene/hexafluoride propylene copolymers (FEP) and polyethylene chloride trifluoride resins (CTFE). Polyvinylidene fluoride resins are superior in terms of weather resistance. However, tetrafluoroethylene/ethylene copolymers are more superior in terms of both weather resistance and mechanical strength. In order to improve adhesion to the material constituting additional layers such as the encapsulating material layer or the like, the surface protective member is preferably subjected to corona treatment and/or plasma treatment. Moreover, in order to improve mechanical strength, it is also possible to employ a sheet subjected to stretch treatment, such as a biaxially stretched polypropylene sheet.

In the case where a glass substrate is employed as the surface protective member for a solar cell module, the glass substrate preferably has total light transmittance of equal to or more than 80% and more preferably equal to or more than 90%, in the wavelength range of 350 to 1,400 nm. For the glass substrate, super white glass, which has less absorption in the infrared region, is generally used; however, soda lime glass has less effect on the output characteristics of the solar cell module as long as the glass substrate is equal to or less than 3 mm in thickness. Moreover, although reinforced glass can be obtained by thermal treatment to improve the mechanical strength of the glass substrate, a float glass substrate which is not subjected to thermal treatment may be employed. In order to suppress light reflection, the glass substrate may also be provided with antireflective coating on the light-incident surface.

Back Surface Protective Member for Solar Cell Module

There are no particular limitations on the back surface protective member for a solar cell module used for a solar cell module. However, since the member is located at the outermost layer of the solar cell module, general properties such as weather resistance, mechanical strength and the like are required in the same manner as in the above surface protective member. Accordingly, the back surface protective member for a solar cell module may be formed of the same material as the surface protective member. That is, the above various materials used as the surface protective member can be used as the back surface protective member. In particular, polyester resins and glass can be suitably used. Moreover, sunlight is not incident on the back surface protective member, so that transparency, which is required for the surface protective member, is not necessarily required. Thus, in order to increase the mechanical strength of the solar cell module, or to prevent deformation or warpage due to the change in temperature, a reinforcement plate may be attached. As the reinforcement plate, for example, a steel plate, a plastic plate, a glass fiber reinforced plastic (FRP) plate or the like can be suitably used.

The encapsulating material for solar cell of the present invention may be integrated with the back surface protective member for a solar cell module. By integrating the encapsulating material for solar cell with the back surface protective member for a solar cell module, it is possible to dispose of the step of cutting both the encapsulating material for solar cell and the back surface protective member for a solar cell module to a size of the module upon module assembling. Moreover, it is possible to shorten or omit the lay-up process by laminating a sheet integrated with the back surface protective member for a solar cell module, rather than individually laminating the encapsulating material for solar cell and the back surface protective member for a solar cell module. When the encapsulating material for solar cell is to be integrated with the back surface protective member for a solar cell module, there are no particular limitations on the lamination method in which the encapsulating material for solar cell is laminated to the back surface protective member for a solar cell module. As preferable examples of the laminating method, there are (i) a method of performing coextrusion using known melt extruders such as a cast molding machine, an extrusion sheet molding machine, an inflation molding machine, and an injection molding machine so as to obtain a laminate, (ii) a method of melt-laminating or heat-laminating a layer on another preformed layer so as to obtain a laminate, (iii) a method of arranging multiple calender molding machines and piling up and rolling sheets discharged from the individual calender molding machines, and the like.

Moreover, the lamination may be effected through a dry lamination method or a heat lamination method in which a suitable adhesive is used. Examples of the adhesive includes maleic anhydride-modified polyolefin resins such as "ADMER" manufactured by Mitsui Chemicals, Inc. and "MODIC" manufactured by Mitsubishi Chemical Corporation); low (non) crystalline elastic polymers such as unsaturated polyolefin and the like; acrylic adhesives represented by a terpolymer of ethylene, acrylate and maleic anhydride such as "BONDINE" manufactured by Sumica CDF; ethylene/vinyl acetate copolymers; and adhesive resin compositions containing the foregoing.

Adhesives with heat resistance of about 120 to 150 degrees centigrade are preferably used. Specific preferable examples thereof include polyester based or polyurethane based adhesives. In order to improve adhesion between the two layers, at least one of the layers may be subjected to silane coupling treatment, titanium coupling treatment, corona treatment, and/or plasma treatment.

Solar Cell Element

There are no particular limitations on the solar cell element used for the solar cell module as long as they can generate electricity by photovoltaic effect of semiconductor. Examples of the solar cell element include silicon (monocrystalline, polycrystalline or amorphous) solar cells, compound semiconductor (III-III Group, II-VI Group and others) solar cells, wet solar cells, organic semiconductor solar cells and the like. Among them, preferably used are polycrystalline silicon solar cells in view of a balance between power generation performance and production costs.

Both the silicon solar cell element and the compound semiconductor solar cell element have superior characteristics as a solar cell element, but are known to be susceptible to breakage by external stress or impact. The encapsulating material for solar cell of the present invention has superior flexibility and thus effectively avoids possible breakage of the solar cell element by absorbing stress or impact to the solar cell element. Accordingly, in the solar cell module of the present invention, it is preferable that a layer made of the encapsulating material for solar cell of the present invention is directly bonded to the solar cell element. Moreover, when the encapsulating material for solar cell has thermal plasticity, the solar cell element can be relatively readily removed even after the manufacture of a solar cell module, thus improving the recycling efficiency. The ethylene resin composition constituting the encapsulating material for solar cell of the present invention has thermal plasticity, and therefore, the encapsulating material for solar cell also has thermal plasticity as a whole, which is preferable in view of the recycling efficiency.

Electrode

There are no particular limitations on the structure and material of electrodes used for the solar cell module; in a specific example, the electrode has a laminate structure consisting of a transparent conductive film and a metal film. The transparent conductive film is made of $SnO_2$, ITO, ZnO or the like. The metal film is made of a metal such as silver, gold, copper, tin, aluminum, cadmium, zinc, mercury, chromium, molybdenum, tungsten, nickel, vanadium or the like. These metal films may be used singly or in the form of an alloy. The transparent conductive film and the metal film are formed by CVD, sputtering, evaporation or the like.

Method for Producing Solar Cell Module

Hereinafter, as an example of a method of manufacturing the solar cell module of the present invention, a method of manufacturing a crystalline silicon solar cell module will be described. The method of manufacturing a crystalline silicon solar cell module involves, for example, a step (i) of forming a laminate by stacking a transparent surface protective member, the encapsulating material for solar cell of the present invention, a solar cell element (cell), an encapsulating material for solar cell and a back surface protective member in this order, and a step (ii) of integrating the resulting laminate by pressurizing and heating.

In the step (i), it is preferable that a surface of the encapsulating material for solar cell with irregularities (emboss) formed thereon is arranged to be the solar cell element side.

In the step (ii), the laminate obtained in the step (i) is integrated (sealed) by heating and pressurizing using a vacuum laminator or a hot press according to a usual method. The encapsulating material for solar cell of the present invention has a high cushioning property, and thus can prevent the solar cell element from being damaged during sealing. Also, the encapsulating material for solar cell of the present invention is superior in degassing, and thus it is possible to manufacture high-quality solar cell modules at a high yield, without entrainment of air.

Also, when a laminate is integrated by pressing and heating (the step (ii)), the ethylene/α-olefin copolymer contained in the encapsulating material for solar cell is crosslinked and cured. In the step (ii), for example, the encapsulating material for solar cell may be temporarily adhered to the solar cell element or the protective material at a temperature to melt the encapsulating material for solar cell of the present invention, without decomposing a crosslinking agent, and then crosslinking of the ethylene/α-olefin copolymer may carried out. Alternatively, heating to a temperature to decompose the crosslinking agency may be performed, and then the encapsulating material for solar cell may be adhered to the solar cell element or the protective material, and at the same time, crosslinking of the ethylene/α-olefin copolymer may be carried out.

For example, in a case of performing temporal adhesion before crosslinking, heating is performed under the conditions of a temperature of 125 to 160 degrees centigrade and a vacuum pressure of 10 Torr or less 3 to 6 minutes. Next, pressuring is subsequently performed at atmospheric pressure for about 1 to 15 minutes to temporarily adhere the above laminate. Then, the ethylene/α-olefin copolymer is crosslinked, for example, using a tunnel-type continuous crosslinking furnace or a tray-type batch crosslinking furnace. During the crosslinking, the heating temperature is generally set to 130 to 155 degrees centigrade and the heating time is set to about 20 to 60 minutes.

On the other hand, in the case of performing crosslinking at the same time as adhesion the encapsulating material for solar cell to the solar cell element or the protective material, heating is performed under the conditions of the heating temperature of 145 to 170 degrees centigrade and a vacuum pressure of 10 Torr or less for 6 to 30 minutes. Next, pressurizing is performed at atmospheric pressure for about 6 to 30 minutes, and the laminate is integrated at the same time as crosslinking.

Also, in a case where the encapsulating material for solar cell contains organic peroxide, the encapsulating material for solar cell is superior in the crosslinking property. For this reason, from the viewpoints of the productivity of the solar cell module and so forth, it is preferable to perform crosslinking at the same time as integration.

Also, the crosslinking is preferably performed until the gel fraction of the ethylene/α-olefin copolymer after the crosslinking becomes 50% to 95%. The gel fraction is more preferably 50% to 90%, further preferably 60% to 90%, and most preferably 65% to 90%. The computing of the gel fraction can be performed by the following method. For example, 1 g of the encapsulating material sheet is sampled from the solar cell module, and Soxhlet extraction is carried out with boiling toluene for 10 hours. The extraction liquid is filtered through a 30-mesh stainless steel mesh, and then the mesh is dried under reduced pressure at 110 degrees centigrade for 8 hours. The weight of the residue on the mesh is measured, and a ratio (%) of the weight of the residue on the mesh to the sample amount (1 g) before the process is considered as the gel fraction.

When the gel fraction is less than 50%, the heat resistance of the encapsulating material for solar cell is insufficient, so that adhesiveness tends to be lowered in a constant temperature/humidity test at 85 degrees centigrade and 85% RH, a high strength xenon irradiation test at a black panel temperature of 83 degrees centigrade, a heat cycle test at −40 to 90 degrees centigrade, or a heat-resistance test. When the gel fraction exceeds 95%, the flexibility of the encapsulating material for solar cell is lowered, and the temperature follow property in the heat cycle test at −40 to 90 degrees centigrade is lowered, thus causing detachment or the like in some cases.

Power Generation Equipment

The solar cell module of the present invention is excellent in the productivity, power generation efficiency, life and the like. Accordingly, a power generation equipment using such a solar cell module is excellent in the costs, power generation efficiency, life and the like, and is of high practical value. The aforementioned power generation equipment can be suitably used for a long period of time regardless whether it is used indoor or outdoor, for example, arrangement on the roof of a building, usage as a portable power source for outdoor activities such as camping, or usage as an auxiliary power source for car batteries.

EXAMPLES

The present invention is now illustrated in detail below with reference to Examples. However, the present invention is not restricted to these Examples.

(1) Measurement Method

Content Ratios of Ethylene Units and α-Olefin Units

A solution obtained by dissolving 0.35 g of a sample in 2.0 ml of hexachlorobutadiene under heating was filtered using a glass filter (G2), and then 0.5 ml of deuterated benzene was added thereto. The resulting mixture was fed into an NMR tube having an internal diameter of 10 mm. The $^{13}$C-NMR was measured at 120 degrees centigrade using a JNM GX-400 type NMR measuring apparatus manufactured by JEOL Ltd. The number of integrations was equal to or more than 8,000 times. The content ratio of the ethylene units and the content ratio of the α-olefin units in the copolymer were quantitatively analyzed from the resulting $^{13}$C-NMR spectrum.

MFR2

MFR2 of an ethylene/α-olefin copolymer was measured under the conditions of a temperature of 190 degrees centigrade and a load of 2.16 kg in accordance with ASTM D1238.

Density

The density of an ethylene/α-olefin copolymer was measured in accordance with ASTM D1505.

Shore A Hardness

An ethylene/α-olefin copolymer was heated at 190 degrees centigrade and pressurized at 10 MPa for 4 minutes, and then pressurized at 10 MPa and cooled down to a normal temperature for 5 minutes to obtain a sheet having a thickness of 3 mm. The shore A hardness of the ethylene/α-olefin copolymer was measured by using the resulting sheet in accordance with ASTM D2240.

Content of Aluminum Element

An ethylene/α-olefin copolymer was decomposed by wet process and then diluted with pure water to a given final volume, and subjected to quantification of aluminum using an ICP analytical emission spectrometer (ICPS-8100 manufactured by Shimadzu Corporation) to determine the content of the aluminum element.

B Value

The B value of an ethylene/α-olefin copolymer was calculated from the aforementioned $^{13}$C-NMR spectrum according to the following equation (1):

$$B\ \text{Value} = [P_{OE}]/(2 \times [P_O] \times [P_E]) \qquad (1)$$

wherein, in the equation (1), $[P_E]$ represents the molar fraction of structural units derived from ethylene contained in the ethylene/α-olefin copolymer; $[P_O]$ represents the molar fraction of structural units derived from α-olefin having 3 to 20 carbon atoms contained in the ethylene/α-olefin copolymer; and $[P_{OE}]$ represents the molar fraction of an α-olefin/ethylene chain contained in the total dyad chain.

Tαβ/Tαα

Tαβ/Tαα of an ethylene/α-olefin copolymer was calculated from the aforementioned $^{13}$C-NMR spectrum with reference to the aforementioned Documents.

Molecular Weight Distribution (Mw/Mn)

Using a gel permeation chromatography (product name: Alliance GPC-2000 model manufactured by Waters Corporation), the weight average molecular weight (Mw) and the number average molecular weight (Mn) of an ethylene/α-olefin copolymer were measured in the following manner to calculate Mw/Mn. Separation columns were two TSKgel GMH6-HT (product name) and two TSKgel GMH6-HTL (product name). The columns had an internal diameter of 7.5 mm and a length of 300 mm. The column temperature was 140 degrees centigrade. The mobile phase was o-dichlorobenzene (a product of Wako Pure Chemical Industries, Ltd.), and 0.025 weight % of BHT (a product of Takeda Pharmaceutical Co., Ltd.) was used as an antioxidant. The mobile phase was passed at a rate of 1.0 ml/minute. The sample concentration was 15 mg/10 ml and the amount of the sample injected was 500 μl. A differential refractometer was used as a detector. For molecular weights of Mw≤1000 and Mw≥4×10$^6$, polystyrenes manufactured by Tosoh Corporation were used as standards. For molecular weights of 1000≤Mw≤4×10$^6$, polystyrenes manufactured by Pressure Chemical Co., Ltd. were used as standards.

Content Ratio of Chlorine Ion

About 10 g of an ethylene/α-olefin copolymer was accurately weighed in a glass container that was sterilized and washed using an autoclave or the like, and 100 ml of ultra pure water was added thereto. The resulting material was tightly sealed and then ultrasonic wave (38 kHz) extraction was carried out at a normal temperature for 30 minutes to obtain an extract. The resulting extract was analyzed using an ion chromatograph apparatus (product name: ICS-2000 manufactured by Dionex Corporation), whereby the content ratio of chlorine ion of the ethylene/α-olefin copolymer was measured.

Extracted Amount in Methyl Acetate

About 10 g of an ethylene/α-olefin copolymer was accurately weighed and Soxhlet extraction was carried out using methyl acetate at a temperature of equal to or more than the boiling point of methyl acetate. The extracted amount of the ethylene/α-olefin copolymer in methyl acetate was calculated from the weight differences in the ethylene/α-olefin copolymer before and after extraction, and the amount of residue after volatilizing the extraction solvent.

Glass Adhesion Strength

A transparent glass plate as the transparent surface protective member for a solar cell and a sheet sample comprising an encapsulating material for solar cell of a thickness of 500 μm were laminated. The resulting laminate was fed into a vacuum laminator (LM-110X160S manufactured by NPC, Inc.), placed on a hot plate at a temperature controlled to 150 degrees centigrade, placed under reduced pressure for 3 minutes and heated for 15 minutes, whereby a sample for adhesion strength, that is, a laminate consisting of a transparent glass plate and a sheet sample, was prepared. A sheet sample layer of this sample for adhesion strength was cut to a size of a width of 15 mm, and the peel strength (glass adhesion strength) to glass was measured in a 180 degree peel test. A tensile tester (product name: Instron1123 manufactured by Instron Corporation) was used for the measurement. In the 180 degree peel test, the peel strength was measured at 23 degrees centigrade at a distance between spans of 30 mm with a tensile speed of 30 mm/minute to adopt an average value of 3 measured values.

Total Light Transmittance

Super white glass without having an absorption region in the wavelength range of 350 to 800 nm was used to obtain a laminate consisting of super white glass, a sheet sample comprising an encapsulating material for solar cell and super white glass under the same conditions as those for the preparation of the above sample for adhesion strength. Using a spectrophotometer (product name: U-3010 manufactured by Hitachi, Ltd.) equipped with an integrating sphere of φ150 mm, the total light transmittance of the sheet sample in the above laminate was measured in the wavelength range of 350 to 800 nm. The total light transmittance of visible light (Tvis) was calculated by multiplying standard light D65 and standard luminous efficiency function V(λ) by measurement results.

Volume Resistivity

A sheet sample comprising an encapsulating material for solar cell was cut to a size of 10 cm×10 cm, and then a crosslinked sheet for measurement was prepared by laminating using a laminator (LM-110X160S manufactured by NPC, Inc.) at 150 degrees centigrade under vacuum for 3 minutes with an applied pressure for 15 minutes. The volume resistivity (Ω·cm) of the prepared crosslinked sheet was measured with an applied resistance of 500 V in accordance with JIS K6911. Incidentally, during the measurement, a pyrometry chamber, 12708 (a product of Advantest Corporation), was used at a temperature of 100±2 degrees centigrade, and a microammeter R8340A (a product of Advantest Corporation) was used.

Electrode Corrosiveness

A sheet sample comprising an encapsulating material for solar cell was sandwiched between a pair of glass plates (thin film electrodes) on which silver was deposited on the center by sputtering. The resulting material was treated under the same conditions as those for the preparation of the above sample for adhesion strength to obtain a laminate. The resulting laminate was subjected to a 2,000 hour-acceleration test in accordance with JIS C8917 using custom-made XL75 (product name) manufactured by Suga Test Instruments Co., Ltd. under the conditions of a chamber internal temperature of 85 degrees centigrade and a humidity of 85%. After the acceleration test, the state of the thin film electrodes in the resulting acceleration test sample was visually observed to evaluate corrosiveness of electrodes.

Solar Cell Element (Cell) Breakage

A silicon crystal type solar cell element having a thickness of 150 μm was cut from an ingot and collected to obtain a laminate consisting of super white glass, a sheet sample, a silicon crystal type solar cell element, a sheet sample and a PET backsheet under the same conditions as those for the preparation of the above sample for adhesion strength. The silicon crystal type solar cell element in the resulting laminate was visually observed to evaluate breakage.

Heat Resistance

A sheet sample comprising an encapsulating material for solar cell was fed into a vacuum laminator, placed on a hot plate at a temperature controlled to 150 degrees centigrade, placed under reduced pressure for 3 minutes and heated for 15 minutes, whereby a crosslinked sheet sample was obtained. The resulting crosslinked sheet sample was cut to a size of a width of 1 cm and a length of 5 cm. Lines were drawn at a length of 3 cm, and the sample was allowed to stand in an oven at 100 degrees centigrade for one hour by hanging a weight of 3 times of the cut sample weight, and a heat-resistance test was carried out. After the test, the elongation rate between lines of the sample was measured. Incidentally, a sample that was fallen during the heat-resistance test was evaluated as "falling."

The heat-resistance test is used as an index of crosslinking properties of the ethylene/α-olefin copolymer. Sufficient crosslinking results in less stretching during the heat-resistance test. Insufficient crosslinking results in high stretching during the heat-resistance test. Further insufficient crosslinking results in "falling" in some cases.

Sheet Blocking Property

Hot press molding was performed using a metal plate for embossing transfer by performing heating at 100 degrees centigrade for 4 minutes, performing pressurizing at 10 MPa for 2 hours, such that an embossing shape was transferred to calender roll sheets (sheet samples made of the encapsulating material for solar cell). The void ratio of each sheet sample was 28%. Further, two sheet samples were laminated with their emboss surfaces upward, and on the configuration of glass, a sheet sample, another sheet sample, and glass with the embossing surfaces upward, a weight of 400 g was put. The resulting material was left in an oven at 40 degrees centigrade for 24 hours, was taken out, and was cooled to ambient temperature, and the peeling strength of the sheets was measured. A tensile tester (product name: Instron1123 manufactured by Instron Corporation) was used for the measurement. In the 180 degree inter-sheet peel test, the peel strength was measured at 23 degrees centigrade at a distance between spans of 30 mm with a tensile speed of 30 mm/minute. An average value of 3 measured values was used to evaluate the sheet blocking property according to the following references.

A: peeling strength less then 50 gf/cm
B: peeling strength of 50 to 100 gf/cm
C: peeling strength more than 100 gf/cm Calender Roll Processability The tearing and the peeling state during calender molding under the following calender roll conditions were evaluated. Also, the tearing means a state where a sheet does not cling to only one calender roll but dispersively clings to two calender rolls. Further, a peeling defect means a state where a sheet has high adhesiveness and thus is adhered to the rolls such that it cannot be peeled.

A: case where calender roll process was possible without tearing and peeling defects
B: case where tearing or a peeling defect occurred but calender roll process was possible by some means or other
C: case where tearing and peeling defects were severe and calender roll process was impossible Sheet Appearance The sheet appearance after calender molding was evaluated under the following calender roll conditions.

A: no flow mark, no irregularities, and constant thickness
B: less flow marks, uneven thickness, and less irregularities
C: many flow marks, uneven thickness, and many irregularities (2) Synthesis of Ethylene/α-Olefin Copolymer Synthesis Example 1

Into one supply port of a continuous polymerization reactor having an interior volume of 50 L equipped with a stirring blade were fed a toluene solution of methyl aluminoxane at a rate of 8 mmol/hr as a cocatalyst, a hexane slurry of bis(1,3-dimethylcyclopentadienyl)zirconium dichloride at a rate of 0.025 mmol/hr as a main catalyst and a hexane solution of triisobutylaluminum at a rate of 0.6 mmol/hr as a main catalyst, and there was continuously fed normal hexane which was purified by dehydration such that the total amount of a catalyst solvent and a polymerization solution was 20 L/hr. At the same time, into another supply port of the polymerization reactor were continuously fed ethylene at a rate of 3 kg/hr, 1-butene at a rate of 15 kg/hr and hydrogen at a rate of 1.5 NL/hr. Continuous solution polymerization was carried out under the conditions of a polymerization temperature of 90 degrees centigrade, a total pressure of 3 MPaG and a retention time of 1.0 hour. A normal hexane/toluene mixed solution of an ethylene/α-olefin copolymer produced at the polymerization reactor was continuously discharged through an outlet arranged at the bottom of the polymerization reactor, and the normal hexane/toluene mixed solution of an ethylene/α-olefin copolymer was introduced into a connection pipe with a jacket section heated at a steam pressure of 3 to 25 kg/cm$^2$ so as to be 150 to 190 degrees centigrade. In addition, immediately before reaching the connection pipe, a supply port into which methanol as a catalyst deactivator was injected was arranged, and methanol was injected at a rate of about 0.75 L/hr and was flowed into the normal hexane/toluene mixed solution of an ethylene/α-olefin copolymer. The normal hexane/toluene mixed solution of an ethylene/α-olefin copolymer maintained at a temperature of about 190 degrees centigrade inside the steam jacket-attached connection pipe was continuously sent to a flush chamber by controlling opening of a pressure control valve attached to the edge section of the connection pipe so as to maintain a pressure of about 4.3 MPaG. Furthermore, in the transport of the solution into the flush chamber, the solution temperature and opening of the pressure control valve were set such that a pressure inside the flush chamber was maintained at about 0.1 MPaG and a temperature of the steam section inside the flush chamber was maintained at about 180 degrees centigrade. Thereafter, passing through a single screw extruder set at a die temperature of 180 degrees centigrade, strands were cooled in a water chamber and were cut using a pellet cutter, whereby an ethylene/α-olefin copolymer was obtained as a pellet. The yield was 2.0 kg/hr. Physical properties are shown in Table 1.

Synthesis Example 2

An ethylene/α-olefin copolymer was obtained in the same manner as in Synthesis Example 1 described above, except that there were fed a hexane solution of [dimethyl(t-butylamide)(tetramethyl-η5-cyclopentadienyl)silane]titanium dichloride at a rate of 0.012 mmol/hr as a main catalyst, a toluene solution of triphenylcarbenium(tetrakispentafluorophenyl)borate at a rate of 0.05 mmol/hr as a cocatalyst and a hexane solution of triisobutylaluminum at a rate of 0.4 mmol/hr respectively, and at the same time there were fed 1-butene at a rate of 5 kg/hr and hydrogen at a rate of 95 NL/h. The yield was 1.3 kg/hr. Physical properties are shown in Table 1.

Synthesis Example 3

An ethylene/α-olefin copolymer was obtained in the same manner as in Synthesis Example 1, except that there were fed a hexane solution of bis(p-tolyl)methylene(cyclopentadienyl)(1,1,4,4,7,7,10,10-octamethyl-1,2,3,4,7,8,9,10-octahydrodibenzo(b,h)-fluorenyl)zirconium dichloride at a rate of 0.003 mmol/hr as a main catalyst, a toluene solution of methyl aluminoxane at a rate of 3.0 mmol/hr as a cocatalyst; there was fed ethylene at a rate of 4.3 kg/hr; there was fed 1-octene at a rate of 6.4 kg/hr instead of 1-butene; there was continuously fed normal hexane which was purified by dehydration such that the total amount of 1-octene, a catalyst solution and normal hexane purified by dehydration used as a polymerization solvent was 20 L/hr; there was fed hydrogen at a rate of 10 NL/hr; and the polymerization temperature was changed to 130 degrees centigrade. The yield was 4.1 kg/hr. Physical properties are shown in Table 1.

Synthesis Example 4

An ethylene/α-olefin copolymer was obtained in the same manner as in Synthesis Example 2, except that there was fed hydrogen at a rate of 100 NL/hr. The yield was 1.2 kg/hr. Physical properties are shown in Table 1.

Synthesis Example 5

An ethylene/α-olefin copolymer was obtained in the same manner as in Synthesis Example 3, except that there was fed hydrogen at a rate of 9 NL/hr. The yield was 4.0 kg/hr. Physical properties are shown in Table 1.

Synthesis Example 6

An ethylene/α-olefin copolymer was obtained in the same manner as in Synthesis Example 1, except that there were fed ethylene at a rate of 2.5 kg/hr, 1-butene at a rate of 21 kg/hr and hydrogen at a rate of 1.2 NL/hr. The yield was 1.9 kg/hr. Physical properties are shown in Table 1.

Synthesis Example 7

An ethylene/α-olefin copolymer was obtained in the same manner as in Synthesis Example 1, except that there were fed 1-butene at a rate of 12 kg/hr and hydrogen at a rate of 1.2 NL/hr. The yield was 2.3 kg/hr. Physical properties are shown in Table 1.

Synthesis Example 8

Into one supply port of a glass continuous polymerization reactor having an interior volume of 2 L/hr equipped with a stirring blade were fed a hexane solution of ethylaluminum sesquichloride at a rate of 40 mmol/hr as a cocatalyst and a hexane solution of dichloroethoxyvanadium oxide at a rate of 2.0 mmol/hr as a main catalyst, and there was continuously fed normal hexane which was purified by dehydration such that the total amount of a catalyst solvent and normal hexane purified by dehydration used as a polymerization solution was 2 L/hr. At the same time, into another supply port of the polymerization reactor were continuously fed ethylene at a rate of 180 NL/hr, 1-butene at a rate of 85 NL/hr and hydrogen at a rate of 4 NL/hr. Continuous solution polymerization was carried out under the conditions of a polymerization temperature of 30 degrees centigrade, a normal pressure and a retention time of 0.5 hours. A normal hexane/toluene mixed solution of an ethylene/α-olefin copolymer produced at the polymerization reactor was continuously discharged through an outlet arranged at the bottom of the polymerization reactor, a supply port into which methanol as a catalyst deactivator was injected was arranged, and methanol was injected at a rate of about 0.2 mL/minute and was flowed into the normal hexane mixed solution of an ethylene/α-olefin copolymer. 2 L of the normal hexane mixed solution of an ethylene/α-olefin copolymer was taken in a glass container having an interior volume of 5 L equipped with a stirring blade, and about 5 mL of 0.5 N dilute hydrochloric acid and 2 L of pure water were added thereto. The resulting material was stirred and then an aqueous phase was separated. Thereafter, 2 L of pure water was added thereto, and stirring and separation of an aqueous phase were carried out five times in the same manner to decalcify the catalyst residue in the ethylene/α-olefin copolymer. The normal hexane mixed solution of the decalcified ethylene/α-olefin copolymer was dried using a vacuum dryer of 130 degrees centigrade to obtain an ethylene/α-olefin copolymer. The yield was 250 g/hr. Physical properties are shown in Table 1.

Synthesis Example 9

An ethylene/α-olefin copolymer was obtained in the same manner as in Synthesis Example 1, except that a toluene solution of methyl aluminoxane was fed at a rate of 33 mmol/hr as a cocatalyst. The yield was 2.0 kg/hr. Physical properties are shown in Table 1.

Synthesis Example 10

An ethylene/α-olefin copolymer was obtained in the same manner as in Synthesis Example 1, except that a toluene solution of methyl aluminoxane was fed at a rate of 40 mmol/hr as a cocatalyst. The yield was 2.1 kg/hr. Physical properties are shown in Table 1.

TABLE 1

|  | Synthesis Example 1 | Synthesis Example 2 | Synthesis Example 3 | Synthesis Example 4 | Synthesis Example 5 |
|---|---|---|---|---|---|
| Kind of α-olefin | 1-butene | 1-butene | 1-octene | 1-butene | 1-octene |
| Content ratio of α-olefin units [mol %] | 14 | 18 | 11 | 17 | 11 |
| Content ratio of ethylene units [mol %] | 86 | 82 | 89 | 83 | 89 |
| Density [g/cm$^3$] | 0.870 | 0.865 | 0.884 | 0.866 | 0.884 |
| MFR2 [g/10 minutes] | 4.0 | 9.5 | 2.1 | 11 | 1.7 |
| Shore A hardness [—] | 70 | 60 | 84 | 62 | 84 |
| B value [—] | 1.11 | 1.11 | 1.16 | 1.12 | 1.16 |
| Tαβ/Tαα [—] | <0.01 | 0.5 | <0.01 | 0.4 | <0.01 |
| Mw/Mn [—] | 2.2 | 2.1 | 2.1 | 2.2 | 2.2 |
| Content ratio of chlorine ion [ppm] | 1.1 | 0.5 | 0.1 | 0.4 | 0.1 |
| Extracted amount in methyl acetate [weight %] | 0.7 | 0.7 | 0.8 | 1.8 | 0.9 |
| Al residue amount [ppm] | 108 | 7 | 22 | 9 | 24 |

TABLE 1-continued

|  | Synthesis Example 6 | Synthesis Example 7 | Synthesis Example 8 | Synthesis Example 9 | Synthesis Example 10 |
|---|---|---|---|---|---|
| Kind of α-olefin | 1-butene | 1-butene | 1-butene | 1-butene | 1-butene |
| Content ratio of α-olefin units [mol %] | 21 | 11 | 18 | 14 | 14 |
| Content ratio of ethylene units [mol %] | 79 | 89 | 83 | 86 | 86 |
| Density [g/cm$^3$] | 0.863 | 0.885 | 0.866 | 0.870 | 0.870 |
| MFR2 [g/10 minutes] | 4.0 | 4.0 | 4.0 | 4.0 | 4.0 |
| Shore A hardness [—] | 56 | 86 | 62 | 70 | 70 |
| B value [—] | 1.11 | 1.11 | 1.11 | 1.11 | 1.11 |
| Tαβ/Tαα [—] | <0.01 | <0.01 | 1.6 | <0.01 | <0.01 |
| Mw/Mn [—] | 2.1 | 2.1 | 2.8 | 2.2 | 2.2 |
| Content ratio of chlorine ion [ppm] | 1.1 | 0.9 | 5.1 | 1.1 | 1.1 |
| Extracted amount in methyl acetate [weight %] | 1.4 | 1.5 | 2.1 | 0.7 | 0.7 |
| Al residue amount [ppm] | 121 | 100 | 5 | 450 | 515 |

(3) Production of Encapsulating Material for Solar Cell (Sheet)

Example 1

There were blended 0.5 weight parts of γ-methacryloxypropyltrimethoxy silane as an ethylenically unsaturated silane compound, 0.6 weight part of t-butylperoxy-2-ethylhexyl carbonate having a one-minute half-life temperature of 166 degrees centigrade as organic peroxide, 1.2 weight parts of triallyl isocyanurate as a crosslinking aid, 0.4 weight parts of 2-hydroxy-4-n-octyloxybenzophenone as an ultraviolet absorber, 0.2 weight parts of bis(2,2,6,6-tetramethyl-4-piperidyl)sebacate as a radical scavenger, 0.1 weight part of tris(2,4-di-tert-butylphenyl)phosphite as a heat-resistant stabilizer 1 and 0.1 weight part of octadecyl-3-(3,5-di-tert-butyl-4-hydroxyphenyl)propionate as a heat-resistant stabilizer 2, based on 100 weight parts of the ethylene/α-olefin copolymer of Synthesis Example 1.

100 g of the blended ethylene composition was fed into a mixing roll machine made by Toyo Seiki Co., Ltd (having two rolls with diameters of 5 inches and rotation speeds of 18 rpm and 15 rpm) having a surface temperature of 100 degrees centigrade, and molding was carried out by calender rolls, whereby calender sheets having a thickness of 500 μm (sheets of encapsulating material for solar cell) were obtained. Various evaluation results of the resulting sheets are shown in Table 2.

Examples 2 to 7

Calender sheets (sheets of encapsulating material for solar cell) were obtained in the same manner as in Example 1 described above, except for blending of the ethylene composition shown in Table 2. Various evaluation results of the resulting sheets are shown in Table 2.

Comparative Examples 1 to 4

Calender sheets (sheets of encapsulating material for solar cell) were obtained in the same manner as in Example 1 described above, except for blending of the ethylene composition shown in Table 2. Various evaluation results of the resulting sheets are shown in Table 2.

TABLE 2

|  | Example 1 | Example 2 | Example 3 | Example 4 | Example 5 |
|---|---|---|---|---|---|
| Blending (weight parts) Ethylene/α-olefin copolymer |  |  |  |  |  |
| Synthesis Example 1 | 100 |  |  | 100 |  |
| Synthesis Example 2 |  | 100 |  |  |  |
| Synthesis Example 3 |  |  | 100 |  | 100 |
| Synthesis Example 4 |  |  |  |  |  |
| Synthesis Example 5 |  |  |  |  |  |
| Synthesis Example 6 |  |  |  |  |  |
| Synthesis Example 7 |  |  |  |  |  |
| Synthesis Example 8 |  |  |  |  |  |
| Ethylenically unsaturated silane compound | 0.5 | 0.5 | 0.5 | 0.25 | 4.8 |
| Organic peroxide | 0.6 | 0.6 | 0.6 | 0.6 | 0.6 |
| Crosslinking aid | 1.2 | 1.2 | 1.2 | 1.2 | 1.2 |
| Ultraviolet absorber | 0.4 | 0.4 | 0.4 | 0.4 | 0.4 |
| Radical scavenger | 0.2 | 0.2 | 0.2 | 0.2 | 0.2 |
| Heat-resistant stabilizer 1 | 0.1 | 0.05 | 0.1 | 0.1 | 0.1 |
| Heat-resistant stabilizer 2 | 0.1 | 0.1 | 0.1 | 0.1 | 0.1 |

TABLE 2-continued

| Evaluation | | | | | |
|---|---|---|---|---|---|
| Total light transmittance [%] | 92 | 93 | 90 | 92 | 90 |
| Glass adhesion strength [N/cm] | 40 | 37 | 34 | 30 | 32 |
| Cell breakage | Not broken | Not broken | Not broken | Not broken | Not broken |
| Heat resistance | 0.2% stretched | 0.8% stretched | 0.1% stretched | 0.7% stretched | 0.5% stretched |
| Electrode corrosiveness | Not corroded | Not corroded | Not corroded | Not corroded | Not corroded |
| Sheet blocking properties | A | B | A | A | A |
| Sheet appearance | A | A | A | A | A |
| Calender processability | A | B | A | A | A |

| | Example 6 | Example 7 |
|---|---|---|
| Blending (weight parts) Ethylene/α-olefin copolymer | | |
| Synthesis Example 1 | 100 | |
| Synthesis Example 2 | | |
| Synthesis Example 3 | | |
| Synthesis Example 4 | | |
| Synthesis Example 5 | | |
| Synthesis Example 6 | | |
| Synthesis Example 7 | | |
| Synthesis Example 8 | | 100 |
| Ethylenically unsaturated silane compound | 0.5 | 0.5 |
| Organic peroxide | 2.8 | 0.6 |
| Crosslinking aid | 1.2 | 1.2 |
| Ultraviolet absorber | 0.4 | 0.4 |
| Radical scavenger | 0.2 | 0.2 |
| Heat-resistant stabilizer 1 | 0.1 | 0.1 |
| Heat-resistant stabilizer 2 | 0.1 | 0.1 |
| Evaluation | | |
| Total light transmittance [%] | 92 | 90 |
| Glass adhesion strength [N/cm] | 38 | 21 |
| Cell breakage | Not broken | Not broken |
| Heat resistance | 0.1% stretched | 0.7% stretched |
| Electrode corrosiveness | Not corroded | Corroded |
| Sheet blocking properties | A | B |
| Sheet appearance | A | A |
| Calender processability | A | A |

| | Comparative Example 1 | Comparative Example 2 | Comparative Example 3 | Comparative Example 4 |
|---|---|---|---|---|
| Blending (weight parts) Ethylene/α-olefin copolymer | | | | |
| Synthesis Example 1 | | | | |
| Synthesis Example 2 | | | | |
| Synthesis Example 3 | | | | |
| Synthesis Example 4 | 100 | | | |
| Synthesis Example 5 | | 100 | | |
| Synthesis Example 6 | | | 100 | |
| Synthesis Example 7 | | | | 100 |
| Synthesis Example 8 | | | | |
| Ethylenically unsaturated silane compound | 0.5 | 0.5 | 0.5 | 0.5 |
| Organic peroxide | 0.6 | 0.6 | 0.6 | 0.6 |
| Crosslinking aid | 1.2 | 1.2 | 1.2 | 1.2 |

TABLE 2-continued

| | | | | |
|---|---|---|---|---|
| Ultraviolet absorber | 0.4 | 0.4 | 0.4 | 0.4 |
| Radical scavenger | 0.1 | 0.1 | 0.2 | 0.2 |
| Heat-resistant stabilizer 1 | 0.1 | 0.05 | 0.1 | 0.1 |
| Heat-resistant stabilizer 2 | 0.1 | 0.1 | 0.1 | 0.1 |
| Evaluation | | | | |
| Total light transmittance [%] | 92 | 90 | 93 | 89 |
| Glass adhesion strength [N/cm] | 31 | 32 | 29 | 39 |
| Cell breakage | Not broken | Not broken | Not broken | Cell broken |
| Heat resistance | 1.5% stretched | 0.2% stretched | 1.5% stretched | — |
| Electrode corrosiveness | Not corroded | Not corroded | Not corroded | Not corroded |
| Sheet blocking properties | B | A | C | A |
| Sheet appearance | B | C | B | B |
| Calender processability | B | B | B | B |

As shown in Table 2, the encapsulating materials for solar cell(sheets) of Examples 1 to 7 containing the ethylene/α-olefin copolymers of Synthesis Examples 1 to 3, and 8 satisfying the requirements (a1) to (a4) specified in the present application had high total light transmittance and were superior in sheet appearance. Also, breakage of solar cell elements did not occur. Further, Examples 1 to 6 having the content ratios of chlorine ion less than 2 ppm in the ethylene/α-olefin copolymers were superior in electrode corrosiveness. However, in Example 7 containing the ethylene/α-olefin copolymer (Synthesis Example 8) and having the content ratio of chlorine ion more than 2 ppm, electrodes were partially corroded.

Also, in Comparative Example 1 containing the ethylene/α-olefin copolymer of Synthesis Example 4 having the MFR2 larger than the value specified in the present application, the amount of low-molecular-weight component in the ethylene/α-olefin copolymer was large, and the elastic modulus was low. For this reason, as compared to Example 1 or the like, calender processability, sheet blocking property, and the like were worse. Also, the crosslinking property of the ethylene/α-olefin copolymer was low, and heat resistance was low.

In Comparative Example 2 containing the ethylene/α-olefin copolymer of Synthesis Example 5 having an MFR2 lower than the value specified in the present application, the elastic modulus of the ethylene/α-olefin copolymer was high, and the sheet molding property was low. For this reason, as compared to Example 1 or the like, the sheet appearance was worse.

Also, Comparative Example 3 containing the ethylene/α-olefin copolymer of Synthesis Example 6 having a density lower than the value specified in the present application, the sheet was sticky, and as compared to Example 1 or the like, the sheet blocking property and the like were low. Further, the crosslinking property was not sufficient, and the heat resistance was low.

Also, in Example 4 having shore A hardness higher than a value specified in the present application, the degree of crystallinity of the ethylene/α-olefin copolymer was high. For this reason, as compared to Example 1 or the like, the transparency of the sheet was low. Further, the flexibility of the sheet was not sufficient, and thus during manufacturing of a laminate, a solar cell element was broken.

Examples 8 to 13

An encapsulating material sheets for solar cell was obtained in the same manner as in Example 1 described above, except for blending shown in Table 3. Various evaluation results of the resulting sheet are shown in Table 3.

TABLE 3

| | Example 8 | Example 9 | Example 10 | Example 11 |
|---|---|---|---|---|
| Blending (weight parts) Ethylene/α-olefin copolymer (A) | | | | |
| Synthesis Example 1 | 100 | | | |
| Synthesis Example 2 | | 100 | | |
| Synthesis Example 3 | | | 100 | |
| Synthesis Example 8 | | | | 100 |
| Synthesis Example 9 | | | | |
| Synthesis Example 10 | | | | |
| Ethylenically unsaturated silane compound | 0.5 | 0.5 | 0.5 | 0.5 |
| Organic peroxide | 0.6 | 0.6 | 0.6 | 0.6 |
| Crosslinking aid | 1.2 | 1.2 | 1.2 | 1.2 |
| Ultraviolet absorber | 0.4 | 0.4 | 0.4 | 0.4 |
| Radical scavenger | 0.2 | 0.2 | 0.2 | 0.1 |
| Heat-resistant stabilizer 1 | 0.1 | 0.05 | 0.1 | 0.1 |
| Heat-resistant stabilizer 2 | 0.1 | 0.1 | 0.1 | 0.1 |
| Evaluation | | | | |
| Volume resistivity at 100° C. [Ω · cm] | $2.3 \times 10^{15}$ | $4.3 \times 10^{14}$ | $2.5 \times 10^{15}$ | $1.7 \times 10^{15}$ |
| Sheet blocking properties | A | A | A | B |
| Sheet appearance | A | A | A | A |

| | Example 12 | Example 13 |
|---|---|---|
| Blending (weight parts) Ethylene/α-olefin copolymer (A) | | |
| Synthesis Example 1 | | |
| Synthesis Example 2 | | |
| Synthesis Example 3 | | |
| Synthesis Example 8 | | |
| Synthesis Example 9 | 100 | |
| Synthesis Example 10 | | 100 |
| Ethylenically unsaturated silane compound | 0.5 | 0.5 |
| Organic peroxide | 0.6 | 0.6 |
| Crosslinking aid | 1.2 | 1.2 |
| Ultraviolet absorber | 0.4 | 0.4 |
| Radical scavenger | 0.1 | 0.2 |

TABLE 3-continued

| | | |
|---|---|---|
| Heat-resistant stabilizer 1 | 0.05 | 0.1 |
| Heat-resistant stabilizer 2 | 0.1 | 0.1 |
| Evaluation | | |
| Volume resistivity at 100° C. [Ω·cm] | $1.2 \times 10^{15}$ | $9.5 \times 10^{14}$ |
| Sheet blocking properties | A | A |
| Sheet appearance | A | B |

As shown in Table 3, in sheets of the encapsulating material for solar cell of Examples 8 to 13 containing Synthesis Examples 1 to 3, 8, 9, and 10 satisfying the requirements a1) to a4) specified in the present application, excellent results were achieved such that the sheet blocking properties of all of them were high and the volume resistivity of the encapsulating materials for solar cell were $1.0 \times 10^{13}$ to $1.0 \times 10^{18}$ Ω·cm. Also, Examples 8 to 12 having aluminum contents of 500 ppm or less in the ethylene/α-olefin copolymers were superior in the sheet appearance. Meanwhile, in Example 13 containing the ethylene/α-olefin copolymer (Synthesis Example 10) having an aluminum content of 500 ppm or more, during sheet forming, in the sheet appearance, some unevenness in the thickness and the like was observed.

Example 14

Using the encapsulating material for solar cell described in Example 8, a mini-module with 18 cells connected in series using monocrystalline cells was prepared and evaluated. As the glass, super white float glass cut to a size of 24×21 cm manufactured by Asahi Glass Fabric Co., Ltd., embossed glass having a thickness of 3.2 mm subjected to thermal treatment, was used. A crystalline cell (monocrystalline cell manufactured by Shinsung Electric Co., Ltd.) cut to a size of 5×3 cm with busbar silver electrodes on a light-incident surface on the center was used. 18 of the cells were connected in series using copper ribbon electrodes in which the surface of a copper foil was coated with eutectic solders. Using a PET backsheet containing silica-deposited PET as a backsheet, a positive terminal and a negative terminal of the cell with 18 cells connected in series by making cuts of about 2 cm on portions taken from the cell on some of the backsheet with a cutter knife were taken out, and were laminated using a vacuum laminator (LM-110×160-S manufactured by NPC, Inc.) under the conditions of a heating plate temperature of 150 degrees centigrade, a vacuum time of 3 minutes and an applied pressure time of 15 minutes. Thereafter, the encapsulating material protruded from the glass and the backsheet were cut, glass edges were provided with an edge encapsulating material, an aluminum frame was attached thereto, and then cut portions of the terminals taken out from the backsheet were provided with RTV silicon. Then, the resulting material was cured.

The positive terminal and the negative terminal of this mini-module were short-circuited, and a high-pressure cable of a power source was connected thereto. Meanwhile, a low-pressure cable of the power source was connected to the aluminum frame which was grounded. This module was set inside a constant temperature/humidity chamber at 85 degrees centigrade and 85% rh, which was maintained in a state that −600V was applied after a temperature rise.

HARb-3R10-LF manufactured by Matsusada Precision Inc. was used as a high pressure power source, while FS-214C2 manufactured by ETAC was used as a constant temperature/humidity chamber.

A voltage was applied for 24 hours and 240 hours, and then IV characteristics of this module were evaluated using a xenon light source having a light intensity distribution of AM (air mass) 1.5 class A. PVS-116i-S manufactured by Nisshinbo Mechatronics Inc. was used for IV evaluation. Also, a case where maximum output power Pmax of IV characteristics after the test was decreased to equal to or more than 5% as compared to the initial value was determined as NG. In Examples, the measurement results were excellent such that the changes in Pmax after the high pressure test were reduced to equal to or less than 0.5%.

Example 15

The test was carried out in the same manner as in Example 14, except that the encapsulating material for solar cell described in Example 10 was used. As a result, excellent results were achieved such that reduction of Pmax was equal to or less than 0.5%.

Example 16

The test was carried out in the same manner as in Example 14, except that the encapsulating material described in Example 9 was used. Excellent results were achieved such that reduction of Pmax after application of a voltage for 24 hours was equal to or less than 0.5%.

Comparative Example 5

Synthesis of Modified Polyvinyl Acetal Resin 100 g of polyvinyl alcohol (PVA-117 manufactured by Kuraray Co., Ltd.) with the ethylene content of 15 mol %, the saponification degree of 98 mol % and the mean degree of polymerization of 1,700 was dissolved in distilled water to obtain an aqueous polyvinyl alcohol solution with the concentration of 10 weight %. This aqueous solution was stirred using an anchor type stirring blade at 40 degrees centigrade and 32 g of 35 weight % hydrochloric acid was added thereto, and then 60 g of butyl aldehyde was added dropwise thereto. It was confirmed that a polyvinyl acetal resin was precipitated in the aqueous solution, and then 64 g of the 35 weight % hydrochloric acid was further added thereto. The resulting mixture was heated up to 50 degrees centigrade and stirred for 4 hours to complete the reaction, whereby a dispersing liquid of a modified polyvinyl acetal resin was obtained. The resulting dispersing liquid was cooled, neutralized until the pH of the dispersing liquid reached 7.5 by a 30 weight % aqueous sodium hydroxide solution, filtered, washed with distilled water in an amount of 20 times the polymer, and was dried to obtain a modified polyvinyl acetal resin with the mean degree of polymerization of 1,700 and the acetalization degree of 65 mol %.

Preparation of Sheet 100 mass parts of the modified polyvinyl acetal resin and 30 mass parts of triethylene glycol-di-2-ethylhexanoate were kneaded under the conditions of a temperature of 100 degrees centigrade for 5 minutes and 30 rpm using a Laboplast mill (a product of Toyo Seiki Co., Ltd.), whereby a modified polyvinyl acetal resin composition was obtained. A SUS metal frame having an opening port of 25×25 cm with a thickness of 0.5 mm was used to set a sheet inside the frame with a vacuum laminator, whereby a smooth sheet was prepared at a heating plate temperature of 100 degrees centigrade for a vacuum time of 3 minutes and an applied pressure time of 10 minutes.

The volume resistivity of the sheet was a resistance value lower than the measurement limit at 100 degrees centigrade, and it was a volume resistivity of equal to or less than $10^8$ Ω·cm. Furthermore, a module was prepared using this sheet in the same manner as in Example 12 with the heating plate temperature of the laminator alone set at 125 degrees centigrade, and a high pressure application test was carried out in the same manner.

The reduced amount of Pmax after application of a voltage for 24 hours was 6%. Characteristics were deteriorated.

The encapsulating material for solar cell of the present invention is to excellent in a balance among general properties such as transparency, flexibility, adhesiveness, heat resistance, appearance, crosslinking properties, electrical properties and calender moldability.

Therefore, the encapsulating material for solar cell of the present invention can be used to provide a solar cell module superior in appearance, performance, and economic efficiency such as the costs or the like.

20 solar cell module
22 solar cell element
22A light-incident surface (of solar cell element)
22B back surface (of solar cell element)
24 surface protective member
26 back surface protective member
28 encapsulating layer
29 interconnector
30 collector line
34A, 34B tab-type busbar
36 conductive layer

The invention claimed is:

1. A solar cell module comprising:
a transparent surface protective member;
a back surface protective member;
a solar cell element; and
an encapsulating layer for encapsulating said solar cell element between said transparent surface protective member and said back surface protective member to be formed by crosslinking an encapsulating material for solar cell,
wherein the encapsulating layer is in direct contact with at least one side of the solar cell element, and
the encapsulating material for solar cell comprises an ethylene/α-olefin copolymer satisfying the following requirements (a1) to (a4) and (a11):
(a1) the content ratio of structural units derived from ethylene is from 80 to 90 mol % and the content ratio of structural units derived from α-olefin having 3 to 20 carbon atoms is from 10 to 20 mol %;
(a2) MFR is equal to or more than 2 g/10 minutes and less than 10 g/10 minutes as measured under the conditions of a temperature of 190 degrees centigrade and a load of 2.16 kg in accordance with ASTM D1238;
(a3) the density is from 0.865 to 0.884 g/cm$^3$ as measured in accordance with ASTM D1505;
(a4) the shore A hardness is from 60 to 85 as measured in accordance with ASTM D2240; and
(a11) the extracted amount of said ethylene/α-olefin copolymer in methyl acetate is equal to or less than 5.0 weight %.

2. The solar cell module according to claim 1, wherein the encapsulating material for solar cell further satisfies the following requirement (a5):
(a5) the volume resistivity is from $1.0 \times 10^{13}$ to $1.0 \times 10^{18}$ Ω·cm as measured at a temperature of 100 degrees centigrade with an applied voltage of 500V in accordance with JIS K6911.

3. The solar cell module according to claim 1, wherein said ethylene/α-olefin copolymer further satisfies the following requirement (a6):
(a6) the content of aluminum element in said ethylene/α-olefin copolymer is from 10 to 500 ppm.

4. The solar cell module according to claim 2, wherein said ethylene/α-olefin copolymer further satisfies the following requirement (a6):
(a6) the content of aluminum element in said ethylene/α-olefin copolymer is from 10 to 500 ppm.

5. The solar cell module according to claim 1, wherein the encapsulating material for solar cell further contains organic peroxide having a one-minute half-life temperature in the range of 100 to 170 degrees centigrade in an amount of 0.1 to 3 weight parts, based on 100 weight parts of said ethylene/α-olefin copolymer.

6. The solar cell module according to claim 1, wherein said ethylene/α-olefin copolymer is polymerized in the presence of a catalyst for olefin polymerization comprising a metallocene compound, and at least one compound selected from the group consisting of an organic aluminumoxy compound and an organic aluminum compound.

7. The solar cell module according to claim 1, wherein the encapsulating material for solar cell comprises an ethylene resin composition containing a silane coupling agent in an amount of 0.1 to 5 weight parts, based on 100 weight parts of said ethylene/α-olefin copolymer.

8. The solar cell module according to claim 7, wherein said ethylene resin composition further comprises at least one kind selected from the group consisting of an ultraviolet absorber, a heat-resistant stabilizer and a hindered amine type light stabilizer in an amount of 0.005 to 5 weight parts, based on 100 weight parts of said ethylene/α-olefin copolymer.

9. The solar cell module according to claim 7, wherein said ethylene resin composition further comprises a crosslinking aid in an amount of 0.05 to 5 weight parts, based on 100 weight parts of said ethylene/α-olefin copolymer.

10. The solar cell module according to claim 1, the encapsulating material for solar cell is obtained by melt-kneading said ethylene/α-olefin copolymer and an additive and then calender-molding the melt-kneaded mixture at the calender molder in a sheet form.

11. The solar cell module according to claim 1, wherein, for said ethylene/α-olefin copolymer,
(a7) the B value determined from the $^{13}$C-NMR spectrum and the following equation (1) is from 0.9 to 1.5, and
(a8) the intensity ratio of Tαβ to Tαα (Tαβ/Tαα) in the $^{13}$C-NMR spectrum is equal to or less than 1.5:

$$B \text{ Value} = [P_{OE}]/(2 \times [P_O] \times [P_E]) \qquad (1)$$

wherein, in the equation (1), $[P_E]$ represents the molar fraction of structural units derived from ethylene contained in said ethylene/α-olefin copolymer; $[P_O]$ represents the molar fraction of structural units derived from α-olefin having 3 to 20 carbon atoms contained in said ethylene/α-olefin copolymer; and $[P_{OE}]$ represents the molar fraction of an α-olefin/ethylene chain contained in the total dyad chain.

12. The solar cell module according to claim 1, wherein (a9) the molecular weight distribution (Mw/Mn) of said ethylene/α-olefin copolymer is in the range of 1.2 to 3.5 as measured by gel permeation chromatography (GPC).

13. The solar cell module according to claim 1, wherein (a10) the content ratio of chlorine ion of said ethylene/α-olefin copolymer is equal to or less than 2 ppm as detected from an extract subjected to solid-phase extraction by ion chromatography.

14. The solar cell module according to claim 1, wherein the encapsulating material for solar cell is in a sheet form.

* * * * *